(12) United States Patent
Kim et al.

(10) Patent No.: US 10,600,679 B2
(45) Date of Patent: Mar. 24, 2020

(54) FAN-OUT SEMICONDUCTOR PACKAGE

(71) Applicant: SAMSUNG ELECTRONICS CO., LTD., Suwon-si (KR)

(72) Inventors: Han Kim, Suwon-si (KR); Mi Ja Han, Suwon-si (KR); Dae Hyun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/668,121

(22) Filed: Aug. 3, 2017

(65) Prior Publication Data
US 2018/0138083 A1 May 17, 2018

(30) Foreign Application Priority Data

Nov. 17, 2016 (KR) .................. 10-2016-0153544
Dec. 5, 2016 (KR) .................. 10-2016-0164516

(51) Int. Cl.
*H01L 21/768* (2006.01)
*H01L 21/48* (2006.01)
(Continued)

(52) U.S. Cl.
CPC .. *H01L 21/76805* (2013.01); *H01L 21/02063* (2013.01); *H01L 21/486* (2013.01); *H01L 21/568* (2013.01); *H01L 21/6835* (2013.01); *H01L 21/76838* (2013.01); *H01L 21/76877* (2013.01); *H01L 23/5389* (2013.01); *H01L 24/19* (2013.01); *H01L 24/24* (2013.01);
(Continued)

(58) Field of Classification Search
CPC ......... H01L 21/76805; H01L 21/02063; H01L 21/486; H01L 21/568; H01L 21/76838; H01L 21/76877; H01L 24/19

USPC ........................................... 257/691
See application file for complete search history.

(56) References Cited

U.S. PATENT DOCUMENTS 6,114,763 A * 9/2000 Smith ............... H01L 21/563
257/692
6,365,963 B1 * 4/2002 Shimada ............. H01L 21/563
257/686
(Continued)

FOREIGN PATENT DOCUMENTS

TW 201327770 A 7/2013
TW 201501247 A 1/2015
TW 201546985 A 12/2015

OTHER PUBLICATIONS

Office Action issued in Taiwanese Patent Application No. 106125819 dated Sep. 26, 2018 (English translation).

*Primary Examiner* — Ori Nadav
(74) *Attorney, Agent, or Firm* — Sughrue Mion, PLLC

(57) ABSTRACT

A fan-out semiconductor package includes a first connection member having a through-hole, first and second semiconductor chips disposed in the through-hole, an encapsulant encapsulating at least portions of the first connection member, the first semiconductor chip, and the second semiconductor chip, and a second connection member disposed on the first connection member and on active surfaces of the first semiconductor chip and the second semiconductor chip. A redistribution layer of the second connection member is respectively connected to both the first and second connection pads through first and second conductors, and the second conductor has a height greater than that of the first conductor.

21 Claims, 19 Drawing Sheets

US 10,600,679 B2
Page 2

(51) Int. Cl.
*H01L 21/56* (2006.01)
*H01L 21/02* (2006.01)
*H01L 23/00* (2006.01)
*H01L 23/538* (2006.01)
*H01L 21/683* (2006.01)
*H01L 23/498* (2006.01)
*H01L 23/31* (2006.01)

(52) U.S. Cl.
CPC ............. *H01L 24/82* (2013.01); *H01L 24/96* (2013.01); *H01L 24/97* (2013.01); *H01L 21/561* (2013.01); *H01L 23/3128* (2013.01); *H01L 23/49816* (2013.01); *H01L 24/32* (2013.01); *H01L 24/73* (2013.01); *H01L 24/92* (2013.01); *H01L 2221/68359* (2013.01); *H01L 2221/68381* (2013.01); *H01L 2224/04105* (2013.01); *H01L 2224/12105* (2013.01); *H01L 2224/24145* (2013.01); *H01L 2224/32145* (2013.01); *H01L 2224/73267* (2013.01); *H01L 2224/8203* (2013.01); *H01L 2224/92244* (2013.01); *H01L 2224/96* (2013.01); *H01L 2924/10252* (2013.01); *H01L 2924/10253* (2013.01); *H01L 2924/10329* (2013.01); *H01L 2924/145* (2013.01); *H01L 2924/1436* (2013.01); *H01L 2924/1438* (2013.01); *H01L 2924/153* (2013.01); *H01L 2924/19041* (2013.01); *H01L 2924/19042* (2013.01); *H01L 2924/19043* (2013.01); *H01L 2924/19105* (2013.01); *H01L 2924/3025* (2013.01); *H01L 2924/3511* (2013.01)

(56) References Cited

U.S. PATENT DOCUMENTS

| | | | | |
|---|---|---|---|---|
| 6,664,644 B2 * | 12/2003 | Morozumi | .......... | H01L 23/3114 257/685 |
| 7,071,568 B1 * | 7/2006 | St. Amand | .......... | H01L 25/0657 257/777 |
| 7,825,520 B1 | 11/2010 | Longo et al. | | |
| 7,906,852 B2 * | 3/2011 | Nishimura | .............. | H01L 24/13 257/777 |
| 7,952,205 B2 * | 5/2011 | Belanger | ................ | H01L 24/11 257/777 |
| 8,236,607 B2 * | 8/2012 | Bathan | ................. | H01L 21/568 438/109 |
| 8,341,835 B1 * | 1/2013 | Huemoeller | ........ | H01L 21/4857 29/841 |
| 9,082,780 B2 * | 7/2015 | Lin | ......... | H01L 24/19 |
| 9,177,901 B2 * | 11/2015 | Pagaila | ............... | H01L 21/568 |
| 9,202,716 B2 * | 12/2015 | Park | ............... | H01L 24/96 |
| 9,601,463 B2 * | 3/2017 | Yu | ................ | H01L 25/0657 |
| 9,875,911 B2 * | 1/2018 | Pagaila | ................ | H01L 21/568 |
| 10,128,211 B2 * | 11/2018 | Chang | ............... | H01L 24/96 |
| 10,217,702 B2 * | 2/2019 | Lin | ........................ | H01L 21/56 |
| 2004/0262774 A1 * | 12/2004 | Kang | ................ | H01L 21/563 257/777 |
| 2008/0054437 A1 * | 3/2008 | Hwang | ............ | H01L 23/49811 257/686 |
| 2010/0193930 A1 * | 8/2010 | Lee | .................... | H01L 23/49816 257/686 |
| 2011/0068427 A1 * | 3/2011 | Paek | ...................... | H01L 24/19 257/433 |
| 2011/0068444 A1 * | 3/2011 | Chi | ..................... | H01L 21/6835 257/669 |
| 2011/0068459 A1 * | 3/2011 | Pagaila | .................. | H01L 21/568 257/698 |
| 2011/0254155 A1 * | 10/2011 | Lin | ..................... | H01L 21/6835 257/737 |
| 2011/0278707 A1 * | 11/2011 | Chi | ..................... | H01L 21/4832 257/676 |
| 2012/0038064 A1 * | 2/2012 | Camacho | ................ | H01L 24/29 257/777 |
| 2012/0181673 A1 | 7/2012 | Pagaila et al. | | |
| 2012/0193789 A1 * | 8/2012 | Hu | ......................... | H01L 21/56 257/738 |
| 2013/0168798 A1 | 7/2013 | Chang et al. | | |
| 2013/0249106 A1 * | 9/2013 | Lin | ........................ | H01L 24/19 257/774 |
| 2014/0070396 A1 | 3/2014 | Kyozuka et al. | | |
| 2014/0360765 A1 | 12/2014 | Kiwanami et al. | | |
| 2015/0001708 A1 | 1/2015 | Lin | | |
| 2015/0001727 A1 | 1/2015 | Lee et al. | | |
| 2015/0243621 A1 * | 8/2015 | Kalandar | ................ | H01L 24/19 257/692 |
| 2015/0364448 A1 | 12/2015 | Huang et al. | | |
| 2018/0337136 A1 * | 11/2018 | Han | .................... | H01L 23/5389 |

* cited by examiner

FAN-OUT SEMICONDUCTOR PACKAGE

CROSS-REFERENCE TO RELATED APPLICATION(S)

This application claims the benefit of priority to Korean Patent Application Nos. 10-2016-0153544, filed on Nov. 17, 2016, and 10-2016-0164516, filed on Dec. 5, 2016 in the Korean Intellectual Property Office, the disclosure of which is incorporated herein by reference in its entirety.

BACKGROUND

1. Field

The present disclosure relates to a semiconductor package, and, more particularly, to a fan-out semiconductor package in which connection terminals may extend outwardly of a region in which a semiconductor chip is disposed.

2. Description of Related Art

Recently, a significant trend in the development of technology related to semiconductor chips has been to reduce the size of semiconductor chips. Therefore, in the field of package technology, in accordance with a rapid increase in demand for small-sized semiconductor chips, and the like, the implementation of a semiconductor package having a compact size, while including a plurality of pins, has been demanded.

One type of package technology suggested to satisfy the technical demand described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a fan-out semiconductor package capable of being thinned and having improved performance and excellent reliability, in spite of using a plurality of semiconductor chips.

According to an aspect of the present disclosure, a fan-out semiconductor package may be provided, in which a plurality of semiconductor chips are stacked and packaged, and are electrically connected to a redistribution layer in the package using multi-stage conductors having different heights, rather than wire bonding.

According to an aspect of the present disclosure, a fan-out semiconductor package includes: a first connection member having a through-hole; a first semiconductor chip disposed in the through-hole and having an active surface having first connection pads disposed thereon and an inactive surface opposing the active surface; a second semiconductor chip disposed on the first semiconductor chip in the through-hole and having an active surface having second connection pads disposed thereon and an inactive surface opposing the active surface; an encapsulant, encapsulating at least portions of the first connection member, the first semiconductor chip, and the second semiconductor chip; and a second connection member disposed on the first connection member and the active surfaces of the first semiconductor chip and the second semiconductor chip. The first connection member and the second connection member respectively include redistribution layers electrically connected to both the first connection pads and the second connection pads, the second semiconductor chip is disposed on the first semiconductor chip to be mismatched to the first semiconductor chip so that the second connection pads are exposed, the redistribution layer of the second connection member is connected to the first connection pads and the second connection pads through first conductors and second conductors, respectively, and the second conductor has a height greater than that of the first conductor.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
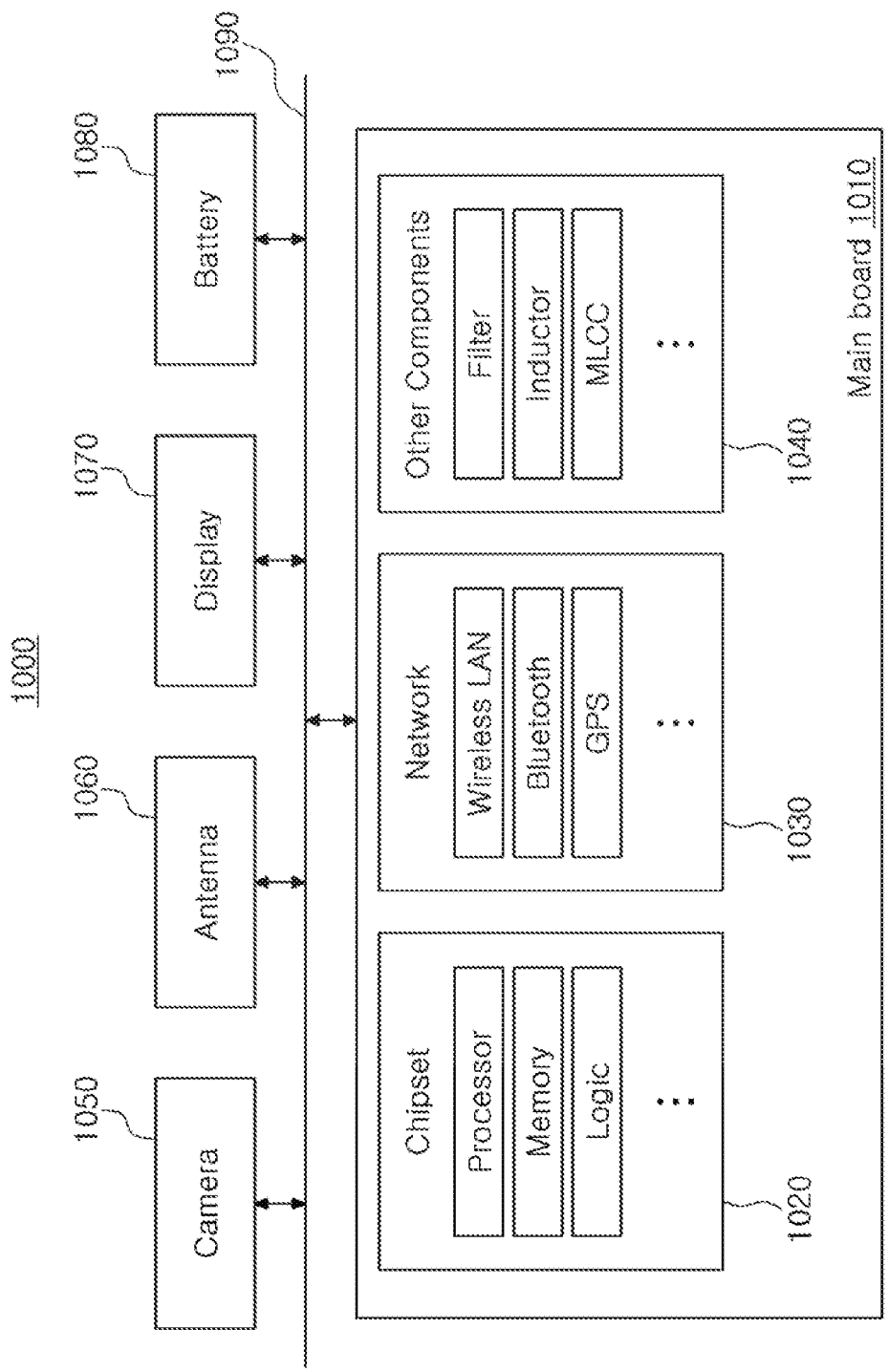
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a main board 1010, therein. The main board 1010 may include chip-related components 1020, network-related components 1030, other components 1040, and the like, physically or electrically connected thereto. These components may be connected to others, to be described below, to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip, such as a central processor (for example, a central processing unit (CPU)), a graphics processor (for example, a graphics processing unit (GPU)), a digital signal processor, a cryptographic processor, a microprocessor, a microcontroller, or the like; and a logic chip, such as an analog-to-digital (ADC) converter, an application-specific integrated circuit (ASIC), or the like. However, the chip-related components 1020 are not limited thereto, but may also include other types of chip-related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network-related components 1030 are not limited thereto, but may also include a variety of other wireless or wired standards or protocols. In addition, the network-related components 1030 may be combined with each other, together with the chip related components 1020 described above.

Other components 1040 may include a high frequency inductor, a ferrite inductor, a power inductor, ferrite beads, a low temperature, co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030, described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive, not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
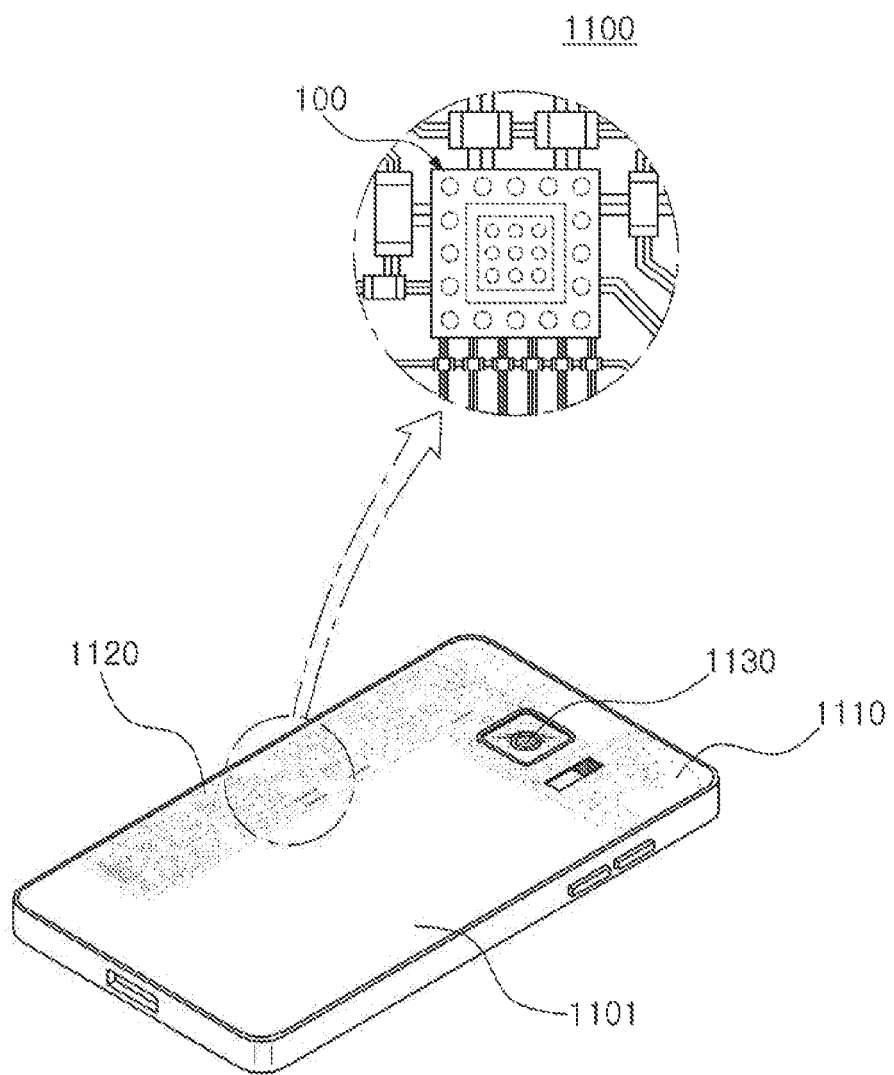
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices, as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required, due to the existence of a difference in a circuit width between the semiconductor chip and a main board of the electronic device, in terms of electrical connections. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to mount the semiconductor chip directly on the main board, and packaging technology for buffering a difference in a circuit width between the semiconductor chip and the main board is required.

A semiconductor package manufactured by the packaging technology may be classified as a fan-in semiconductor package or a fan-out semiconductor package, depending on a structure and a purpose thereof.

The fan-in semiconductor package and the fan-out semiconductor package will hereinafter be described in more detail with reference to the drawings.

(Fan-in Semiconductor Package)

Figure 3B:
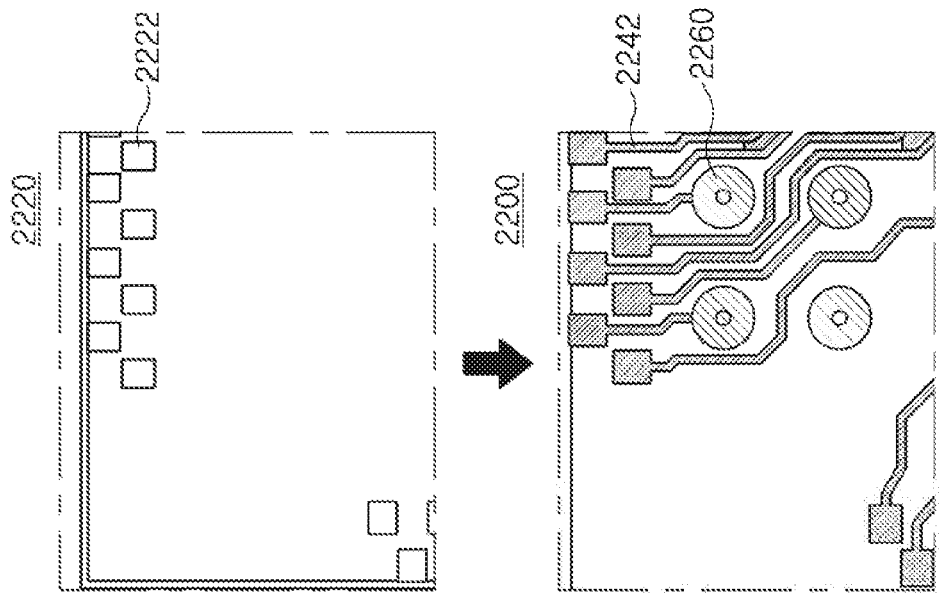
FIGS. 3A and 3B are schematic cross-sectional views illustrating states of a fan-in semiconductor package before and after being packaged.
Figure 3A:
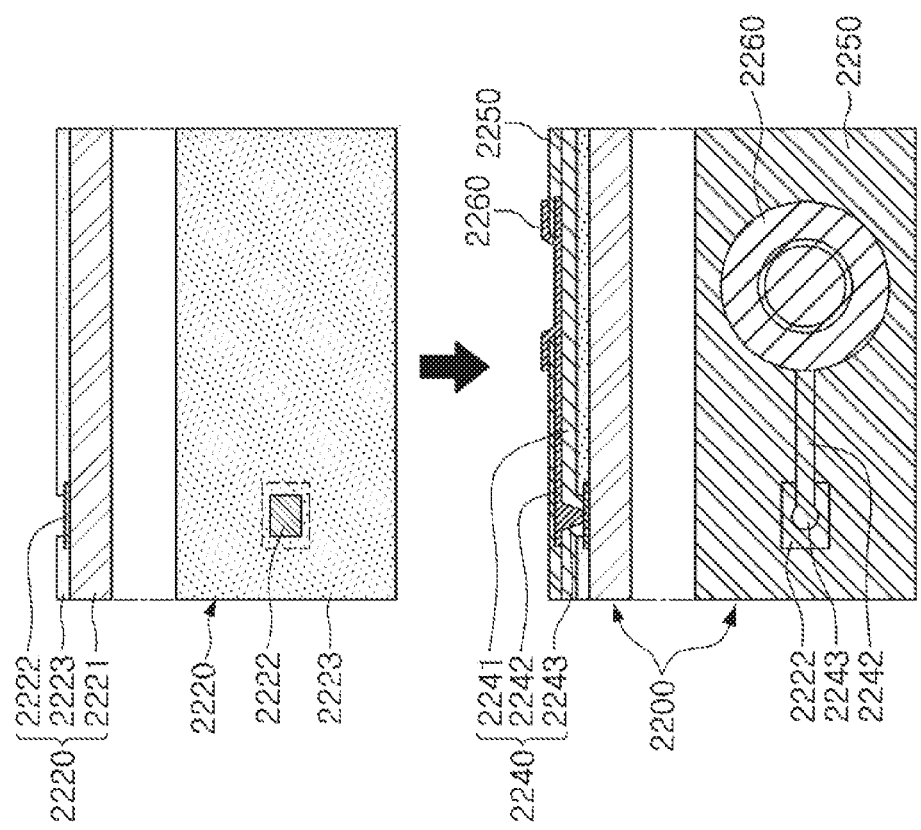

FIGS. 3A and 3B are schematic cross-sectional views illustrating states of a fan-in semiconductor package before and after being packaged.

Figure 4:
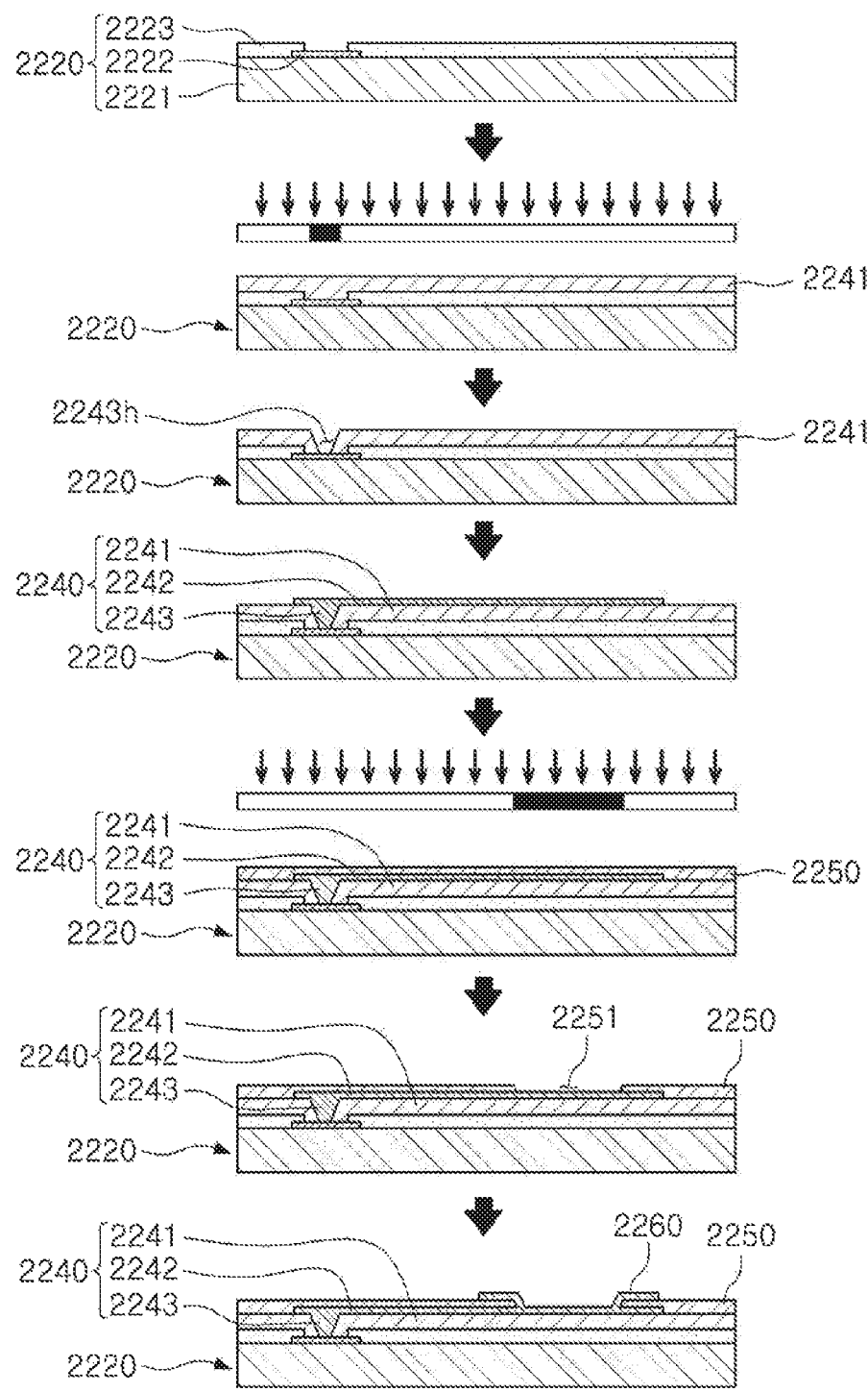
FIG. 4 is a number of schematic cross-sectional views illustrating a packaging process of a fan-in semiconductor package.

FIG. 4 is a number of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are very small, it is difficult to mount the integrated circuit (IC) on an intermediate level printed circuit board (PCB) or on the main board of the electronic device, or the like.

Therefore, a connection member 2240 may be formed, depending on a size of the semiconductor chip 2220, on the semiconductor chip 2220 in order to redistribute the connection pads 2222. The connection member 2240 may be formed by forming an insulating layer 2241 on the semiconductor chip 2220, using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260, may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has a large spatial requirement. Therefore, it is difficult to apply this structure to a semiconductor chip having a large number of I/O terminals or a semiconductor chip having a compact size. In addition, due to the disadvantage described above, the fan-in semiconductor package may not be mounted and used directly on the main board of the electronic device. This is due to the fact that, even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to mount the fan-in semiconductor package directly on the main board of the electronic device.

Figure 5:
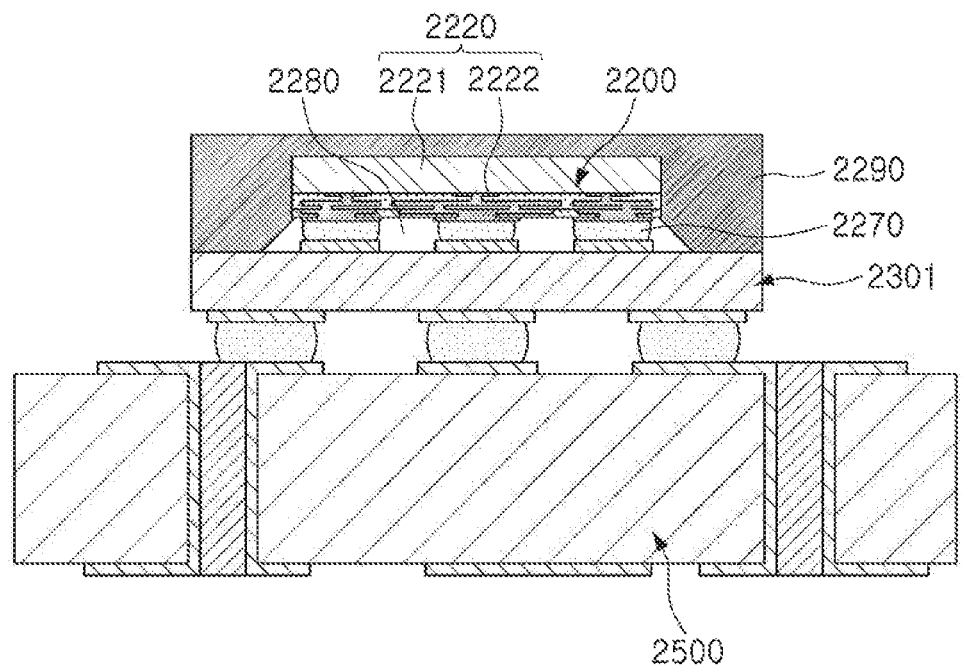
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
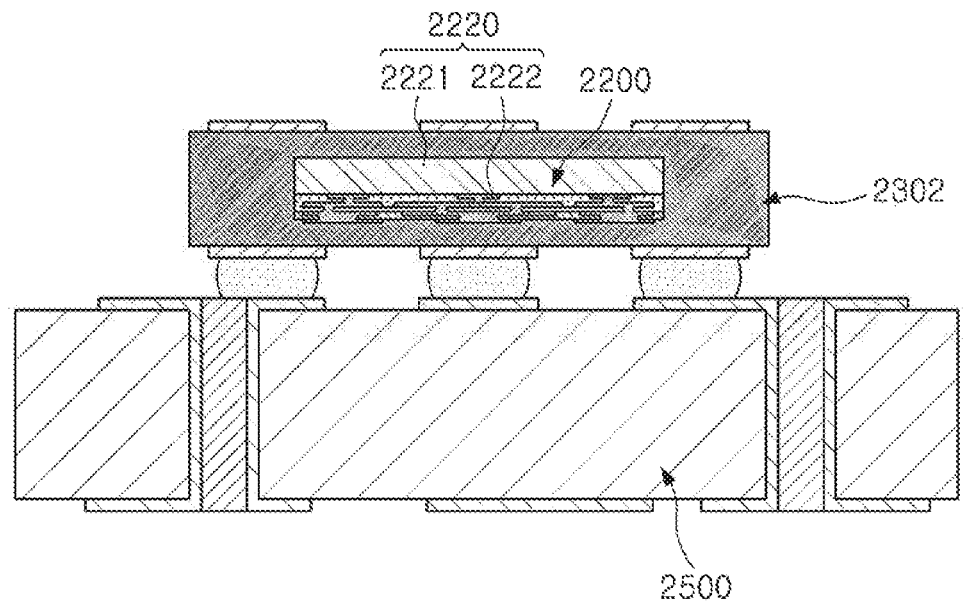
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may again be redistributed through an interposer substrate 2301, and the fan-in semiconductor package 2200 may be finally mounted on a main board 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to mount and use the fan-in semiconductor package directly on the main board of the electronic device. Therefore, the fan-in semiconductor package may be mounted on the separate interposer substrate and then be mounted on the main board of the electronic device through a packaging process or may be mounted and used on the main board of the electronic device in a state in which it is embedded in the interposer substrate.

(Fan-Out Semiconductor Package)

Figure 7:
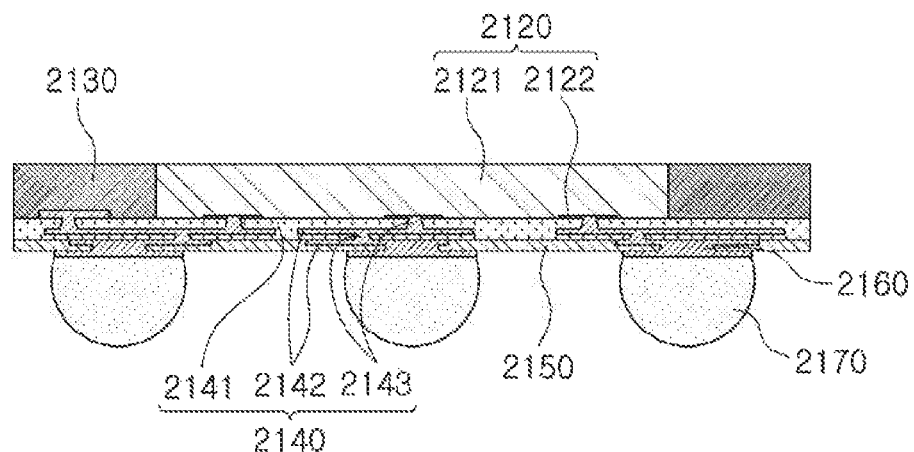
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, an outer side of a semiconductor chip 2120, for example, may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
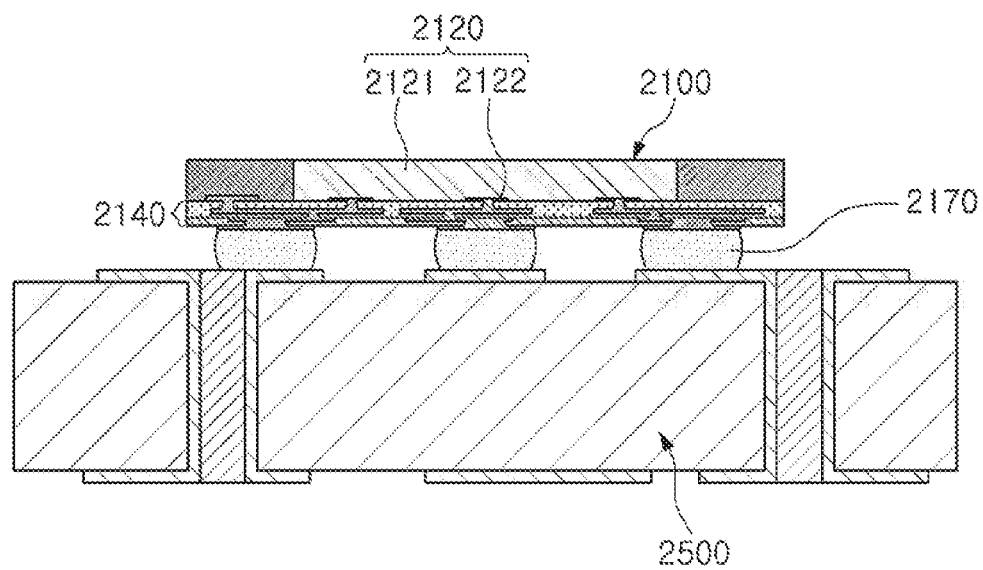
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region having a greater area than the semiconductor chip 2120, such that the standardized ball layout may be used in the fan-out semiconductor package 2100 without modification. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thinner thickness than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package capable of being thinned and having improved performance and excellent reliability in spite of using a plurality of semiconductor chips will hereinafter be described with reference to the drawings.

Figure 9:
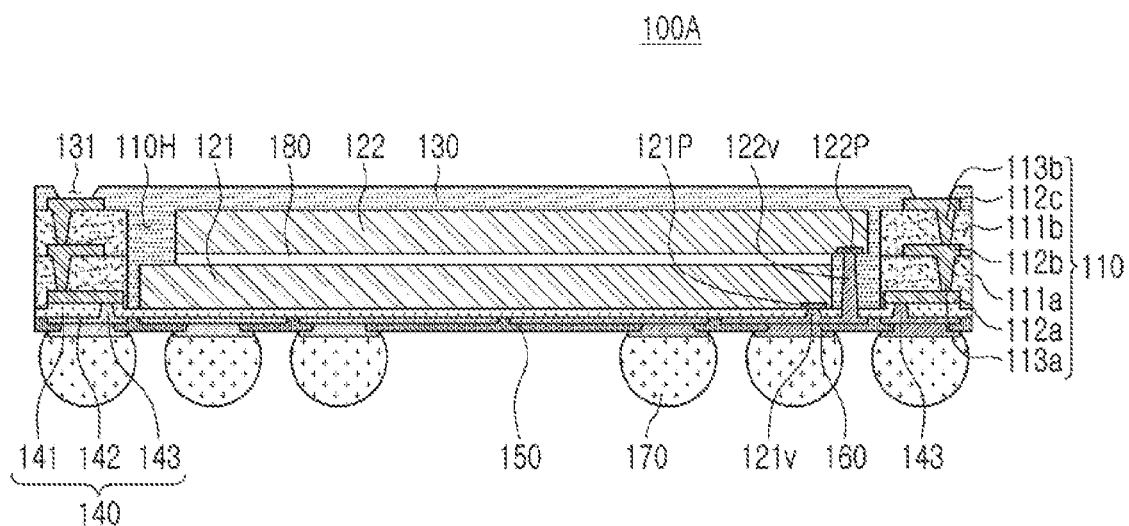
FIG. 9 is a schematic cross-sectional view illustrating an example of a fan-out semiconductor package.

FIG. 9 is a schematic cross-sectional view illustrating an example of a fan-out semiconductor package.

Figure 10:
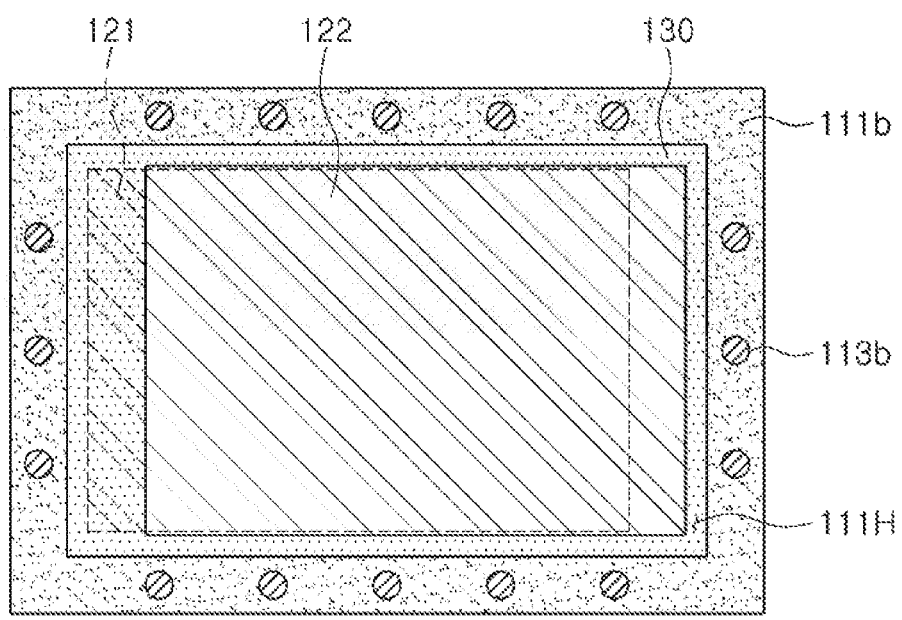
FIG. 10 is a schematic plan view of the fan-out semiconductor package of FIG. 9.

FIG. 10 is a schematic plan view of the fan-out semiconductor package of FIG. 9.

Referring to the drawings, a fan-out semiconductor package 100A according to an exemplary embodiment in the present disclosure may include a first connection member 110 having a through-hole 110H, a first semiconductor chip 121 disposed in the through-hole 110H and having an active surface having first connection pads 121P disposed thereon and an inactive surface opposing the active surface, a second semiconductor chip 122 disposed on the first semiconductor chip 121 in the through-hole 110H and having an active surface having second connection pads 122P disposed thereon and an inactive surface opposing the active surface, an encapsulant 130 encapsulating at least portions of the first connection member 110, the first semiconductor chip 121, and the second semiconductor chip 122, and a second connection member 140 disposed on the first connection member 110 and the active surfaces of the first semiconductor chip 121 and the second semiconductor chip 122. The first connection member 110 may include redistribution layers 112a, 112b, and 112c electrically connected to the first connection pads 121P and the second connection pads 122P. The second connection member 140 may include a redistribution layer 142 electrically connected to the first connection pads 121P and the second connection pads 122P. The active surface of the second semiconductor chip 122 may be attached to the inactive surface of the first semiconductor chip 121, and the second semiconductor chip 122 may be disposed on the first semiconductor chip 121, to be mismatched to the first semiconductor chip 121 so that the second connection pads 122P are exposed. The phrase, 'disposed to be mismatched', means that side surfaces of the first semiconductor chip 121 and side surfaces of the second semiconductor chip 122 do not coincide with each other. The redistribution layer 142 of the second connection member 140 may be connected to the first connection pads 121P and the second connection pads 122P through first conductors 121v and second conductors 122v, respectively. The second conductor 122v may be have a height greater than that of the first conductor 121v.

Figure 29:
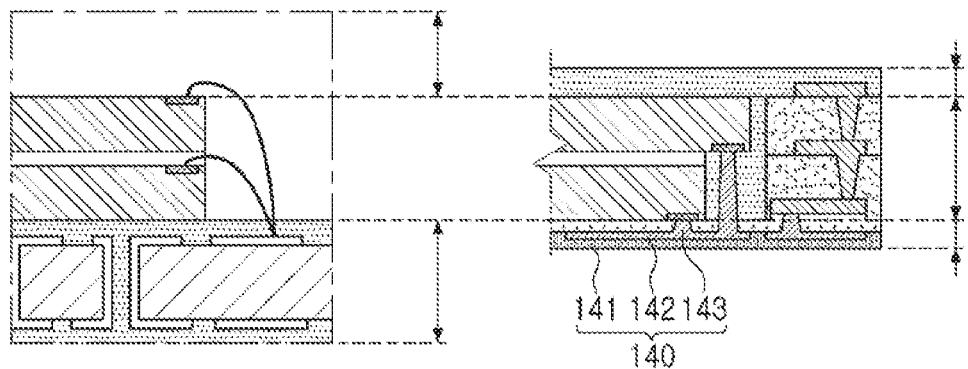
FIG. 29 is a schematic view illustrating an effect of a fan-out semiconductor package according to an exemplary embodiment in the present disclosure.
Figure 30:
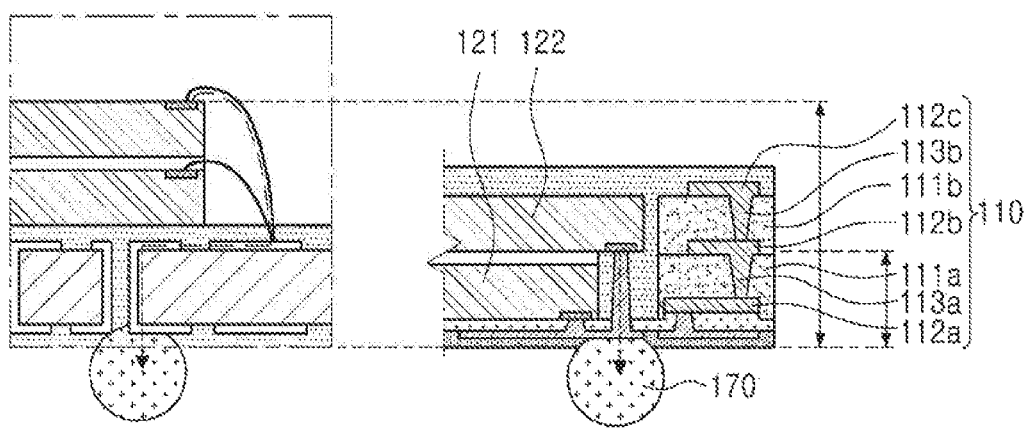
FIG. 30 is a schematic view illustrating another effect of a fan-out semiconductor package according to an exemplary embodiment in the present disclosure.

Meanwhile, recently, technology for stacking a plurality of memory chips in multiple stages, in order to increase a capacity of a memory, has been developed. For example, as illustrated on the left side of FIGS. 29 and 30, there may be a technology for stacking a plurality of memory chips in two stages (or three stages), mounting the stacked memory chips on an interposer substrate, and then molding the stacked memory chips mounted on the interposer substrate using a molding material to form a package. In this case, the stacked memory chips are electrically connected to the interposer substrate by wire bonding. However, in this structure, there is a limitation in thinness due to a significant thickness of the interposer substrate. In addition, when the interposer substrate is manufactured on the basis of silicon, a significant cost is required. Also, when a reinforcing material holding the stacked memory chips is not separately included, a problem may occur in reliability, due to warpage. Lastly, since the stacked memory chips are electrically connected to the interposer substrate by the wire bonding, such that inputs and outputs are redistributed, signal paths are significantly long, such that signal loss may frequently occur.

On the other hand, in the fan-out semiconductor package 100A according to the exemplary embodiment, the first connection member 110 having the redistribution layers 112a, 112b, and 112c may be introduced, and a plurality of stacked semiconductor chips 121 and 122 may be disposed in the through-hole 110H of the first connection member 110. In addition, the second connection member 140, including the redistribution layer 142, may be formed instead of introducing the interposer substrate. In particular, the plurality of stacked semiconductor chips 121 and 122 may be connected to the redistribution layer 142 of the second connection member 140 through multi-stage conductors 121v and 122v having different heights, rather than through wire bonding. Therefore, as illustrated on a right side of FIG. 29, the redistribution may be distributed to various positions, such that a thickness of the second connection member 140 may be significantly reduced, and a backside encapsulation thickness, or a thickness of the stacked chips, may also be significantly reduced. In addition, illustrated in a right side of FIG. 30, signal paths from the stacked semiconductor chips 121 and 122 to connection terminals 170 may be significantly reduced, and signal loss is thus reduced, resulting in improvement of signal electrical characteristics. In addition, warpage may be controlled through the first connection member 110, and reliability may thus be improved.

The respective components included in the fan-out semiconductor package 100A according to the exemplary embodiment will hereinafter be described in more detail.

The first connection member 110 may include the redistribution layers 112a, 112b, and 112c, redistributing the connection pads 121P and 122P of the semiconductor chips 121 and 122 to thus reduce the number of layers of the second connection member 140. If necessary, the first connection member 110 may maintain rigidity of the fan-out semiconductor package 100A depending on certain materials, and may serve to secure uniformity of a thickness of the encapsulant 130. In addition, due to the first connection member 110, the fan-out semiconductor package 100A according to the exemplary embodiment may be used as a portion of a package-on-package. The first connection member 110 may have the through-hole 110H. The stacked semiconductor chips 121 and 122 may be disposed in the through-hole 110H to be spaced apart from the first connection member 110 by a predetermined distance. The side surfaces of the semiconductor chips 121 and 122 may be surrounded by the first connection member 110. However, such a form is only an example and may be variously modified to have other forms, and the first connection member 110 may perform another function, depending on such a form.

The first connection member 110 may include a first insulating layer 111a in contact with the second connection member 140, a first redistribution layer 112a in contact with the second connection member 140 and embedded in the first insulating layer 111a, a second redistribution layer 112b disposed on the other surface of the first insulating layer 111a, opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 121P and 122P. The first and second redistribution layers 112a and 112b and the second and third redistribution layers 112b and 112c may be electrically connected to each other through first and second vias 113a and 113b, penetrating through the first and second insulating layers 111a and 111b, respectively.

Since the first redistribution layer 112a is embedded in the first insulating layer 111a, an insulating distance of an insulating layer 141 of a second connection member 140 may be substantially constant. Since the first connection member 110 may include a large number of redistribution layers 112a, 112b, and 112c, the second connection member 140 may be simplified. Therefore, a decrease in a yield after disposition of the semiconductor chips 121 and 122, due to a defect occurring in a process of forming the second connection member 140, may be suppressed. The first redistribution layer 112a may be recessed in the first insulating layer 111a, such that a lower surface of the first insulating layer 111a and a lower surface of the first redistribution layer 112a may have a step therebetween. As a result, when the encapsulant 130 is formed, a phenomenon in which a material of the encapsulant 130 bleeds, to pollute the first redistribution layer 112a, may be prevented.

Thicknesses of the redistribution layers 112a, 112b, and 112c of the first connection member 110 may be thicker than that of the redistribution layer 142 of the second connection member 140. Since the first connection member 110 may have a thickness greater than or equal to that of the stacked semiconductor chips 121 and 122, the redistribution layers 112a, 112b, and 112c may be formed in large sizes, depending on a scale of the first connection member 110. On the other hand, the redistribution layer 142 of the second connection member 140 may be formed in a relatively small size, for thinness.

A material of each of the insulating layers 111a and 111b is not particularly limited. For example, an insulating material may be used as the material of each of the insulating layers. In this case, the insulating material may be a thermosetting resin, such as an epoxy resin, a thermoplastic resin, such as a polyimide resin, an insulating material in which the thermosetting resin or the thermoplastic resin is impregnated with an inorganic filler or a core material such as a glass fiber (or a glass cloth or a glass fabric), for example, prepreg, Ajinomoto Build up Film (ABF), FR-4, Bismaleimide Triazine (BT), or the like. Alternatively, a photoimagable dielectric (PID) resin may also be used as the material of each of the insulating layers 111a and 111b.

The redistribution layers 112a, 112b, and 112c may serve to redistribute the connection pads 121P and 122P of the semiconductor chips 121 and 122, and a material of each of the redistribution layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The redistribution layers 112a, 112b, and 112c may perform various functions, depending on designs of their corresponding layers. For example, the redistribution layers 112a, 112b, and 112c may include ground (GND) patterns, power (PWR) patterns, signal (S) patterns, and the like. Here, the signal (S) patterns may include various signals, such as data signals, and the like, except for the ground (GND) patterns, the power (PWR) patterns, and the like. In addition, the redistribution layers 112a, 112b, and 112c may include various via pad patterns, and the like.

The vias 113a and 113b may electrically connect the redistribution layers 112a, 112b, and 112c formed on different layers from each other, resulting in an electrical path in the first connection member 110. A material of each of the vias 113a and 113b may be a conductive material. Each of the vias 113a and 113b may be completely filled with the conductive material, or the conductive material may be formed along a wall of each of via holes. In addition, each of the vias 113a and 113b may have any of the shapes known in the related art, such as a tapered shape, a cylindrical shape, and the like. Meanwhile, it may be advantageous in a process of forming each of the vias 113a and 113b to have a tapered shape of which a width of an upper surface is greater than that of a lower surface.

The semiconductor chips 121 and 122 may be an integrated circuit (IC) provided in an amount of several hundreds to several millions of elements or more integrated in a single chip. The IC may be a volatile memory (such as a DRAM), a non-volatile memory (such as a ROM), a flash memory, or the like, but is not limited thereto. The active surfaces of the semiconductor chips 121 and 122 refer to surfaces of the semiconductor chips 121 and 122 on which the connection pads 121P and 122P are disposed, and the inactive surfaces thereof refer to surfaces opposing the active surfaces.

The semiconductor chips 121 and 122 may be formed on the basis of an active wafer. In this case, a base material of each of bodies of the semiconductor chips 121 and 122 may be silicon (Si), germanium (Ge), gallium arsenide (GaAs), or the like. Various circuits may be formed on the bodies. The connection pads 121P and 122P may electrically connect the semiconductor chips 121 and 122 to other components. A material of each of the connection pads 121P and 122P may be a conductive material such as aluminum (Al), or the like. A passivation layer (not illustrated) exposing the connection pads 121P and 122P may be formed on the bodies, and may be an oxide film, a nitride film, or the like, or a double layer of an oxide layer and a nitride layer. An insulating layer (not illustrated), and the like, may also be further disposed in other required positions.

The semiconductor chips 121 and 122 may be connected to the redistribution layer 142 of the second connection member 140 through the conductors 121v and 122v having different heights. In this case, the first conductors 121v may not penetrate through the encapsulant 130, while the second conductor 122v may penetrate through the encapsulant 130. That is, the first conductor 121v may not be in contact with the encapsulant 130, while the second conductor 122v may be in contact with the encapsulant 130. The active surface of the second semiconductor chip 122 may include a first side portion facing the inactive surface of the first semiconductor chip 121, a central portion facing the inactive surface of the first semiconductor chip 121, and a second side portion, symmetrical to the first side portion in relation to the central portion of the active surface of the second semiconductor chip 122, and being at least partially off of the inactive surface of the first semiconductor chip 121. In this case, the second connection pads 122P may be disposed on the second side portion of the active surface of the second semiconductor chip 122. That is, the semiconductor chips 121 and 122 may be disposed to be mismatched to each other in a step form, and the second connection pads 122P may be disposed on the second side portion of the active surface of the second semiconductor chip 122, such that the multi-stage conductors 121v and 122v having the different heights may be applied.

The semiconductor chips 121 and 122 may be attached to each other through an adhesive member 180. The adhesive member 180 is not particularly limited, but may be a material that may attach the semiconductor chips 121 and 122 to each other, such as a known tape, adhesive, or the like. In some cases, the adhesive member 180 may also be omitted. Meanwhile, a disposition of the semiconductor chips 121 and 122 is not limited to a form illustrated in the drawings. That is, the semiconductor chips 121 and 122 may also be disposed in a form different from that illustrated in the plan view, as long as they may be disposed to be mismatched to each other and the multi-stage conductors 121v and 122v may be applied.

The encapsulant 130 may protect the first connection member 110 and/or the semiconductor chips 121 and 122. An encapsulation form of the encapsulant 130 is not particularly limited, but may be a form in which the encapsulant 130 surrounds at least portions of the first connection member 110 and/or the semiconductor chips 121 and 122. For example, the encapsulant 130 may cover at least portions of the first connection member 110 and the inactive surfaces of the semiconductor chips 121 and 122, and fill spaces between walls of the through-hole 110H and the side surfaces of the semiconductor chips 121 and 122. Meanwhile, the encapsulant 130 may fill the through-hole 110H to thus serve as an adhesive and reduce buckling of the semiconductor chips 121 and 122, depending on certain materials.

The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, a known molding material, such as an epoxy molding compound (EMC), or the like, may also be used. Alternatively, a material in which a thermosetting resin or a thermoplastic resin is impregnated in an inorganic filler and/or a core material such as a glass fiber (or a glass cloth or a glass fabric) may be used as the insulating material.

The second connection member 140 may be configured to redistribute the connection pads 121P and 122P of the semiconductor chips 121 and 122. Several tens to several hundreds of connection pads 121P and 122P having various functions may be redistributed by the second connection member 140, and may be physically or electrically connected to an external source through connection terminals 170, to be described below, depending on the functions. The second connection member 140 may include insulating layers 141, the redistribution layers 142 disposed on the insulating layers 141, and vias 143 penetrating through the insulating layers 141 and connecting the redistribution layers 142 to each other. In the fan-out semiconductor package 100A according to the exemplary embodiment, the second connection member 140 may include a single layer, but may also include a plurality of layers.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a thinner thickness, and a fine pitch of the via 143 may be achieved more easily. The insulating layer 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other, depending on a process, whereby a boundary therebetween may not be apparent.

The redistribution layers 142 may serve to substantially redistribute the connection pads 121P and 122P. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals, such as data signals, and the like, except for the ground (GND) patterns, the power (PWR) patterns, and the like. In addition, the redistribution layers 142 may include various pad patterns such as via pads, connection terminal pads, and the like.

The vias 143 may electrically connect the redistribution layers formed on different layers from each other, resulting in an electrical path in the fan-out semiconductor package 100A. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may be formed along a wall of each of the vias. In addition, each of the vias 143 may have any of the shapes known in the related art, such as a tapered shape, a cylindrical shape, and the like.

A passivation layer 150 may be additionally configured to protect the second connection member 140 from external physical or chemical damage. The passivation layer 150 may have openings 151 exposing at least portions of the redistribution layer 142 of the second connection member 140. The number of openings formed in the passivation layer 150 may be several tens to several thousands.

A material of the passivation layer 150 is not particularly limited, but may be a photosensitive insulating material such as a PID resin. Alternatively, a solder resist may also be used as the material of the passivation layer 150. Alternatively, an insulating resin that does not include a core material, but includes a filler, for example, ABF including an inorganic filler and an epoxy resin may be used as the material of the passivation layer 150. In a case in which an insulating material that includes an inorganic filler and an insulating resin, but does not include a core material, such as the ABF, or the like, is used as the material of the passivation layer 150, the passivation layer 150 and a resin layer 182 may be symmetrical to each other, which may control warpage dispersion, and may be more effective in controlling warpage. When the insulating material including the inorganic filler and the insulating resin, such as the ABF, or the like, is used as the material of the passivation layer 150, the insulating layer 141 of the second connection member 140 may also include an inorganic filler and an insulating resin. In this case, a weight percent of the inorganic filler included in the passivation layer 150 may be greater than that of the inorganic filler included in the insulating layer 141 of the second connection member 140. In this case, the passivation layer 150 may have a relatively low coefficient of thermal expansion (CTE), and may be utilized to control the warpage.

An underbump metal layer 160 may be configured to improve connection reliability of the connection terminals 170 and improve board level reliability of the fan-out semiconductor package 100A. The underbump metal layer 160 may be connected to the redistribution layer 142 of the second connection member 140, opened through the openings 151 of the passivation layer 150. The underbump metal layer 160 may be formed in the openings 151 of the passivation layer 150 by a known metallization method using a known conductive material such as a metal, but is not limited thereto.

The connection terminals 170 may be additionally configured to physically or electrically, externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) pillar and a solder. When the connection terminals 170 are formed as a single layer structure, the connection terminals 170 may include a tin-silver solder or copper (Cu). However, these are only examples, and the connection terminals 170 are not limited thereto.

The number, an interval, a disposition, or the like, of the connection terminals 170 is not particularly limited, and may be sufficiently modified by a person skilled in the art, depending on design particulars. For example, the connection terminals 170 may be provided in an amount of several tens to several thousands or may be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be superior to when other materials are used in the connection terminals.

At least one of the connection terminals 170 may be disposed in a fan-out region. The fan-out region is a region except for a region in which the semiconductor chip 120 is disposed. That is, the fan-out semiconductor package 100A according to the exemplary embodiment may be a fan-out package. The fan-out package may have excellent reliability, as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to be thin, and may be price competitive.

Meanwhile, although not illustrated in the drawings, a metal layer may be further disposed on the wall of the through-hole 110H, if necessary. The metal layer may serve to effectively dissipate heat generated from the semiconductor chips 121 and 122. In addition, the metal layer may also serve to block electromagnetic waves. Further, a separate passive component such as a capacitor, an inductor, or the like, may be further disposed in the through-hole 110H. In addition to the structures described above, the structures known in the related art may also be applied.

FIGS. 11A through 11D are schematic views illustrating an example of processes of manufacturing the fan-out semiconductor package of FIG. 9.

Figure 11A:
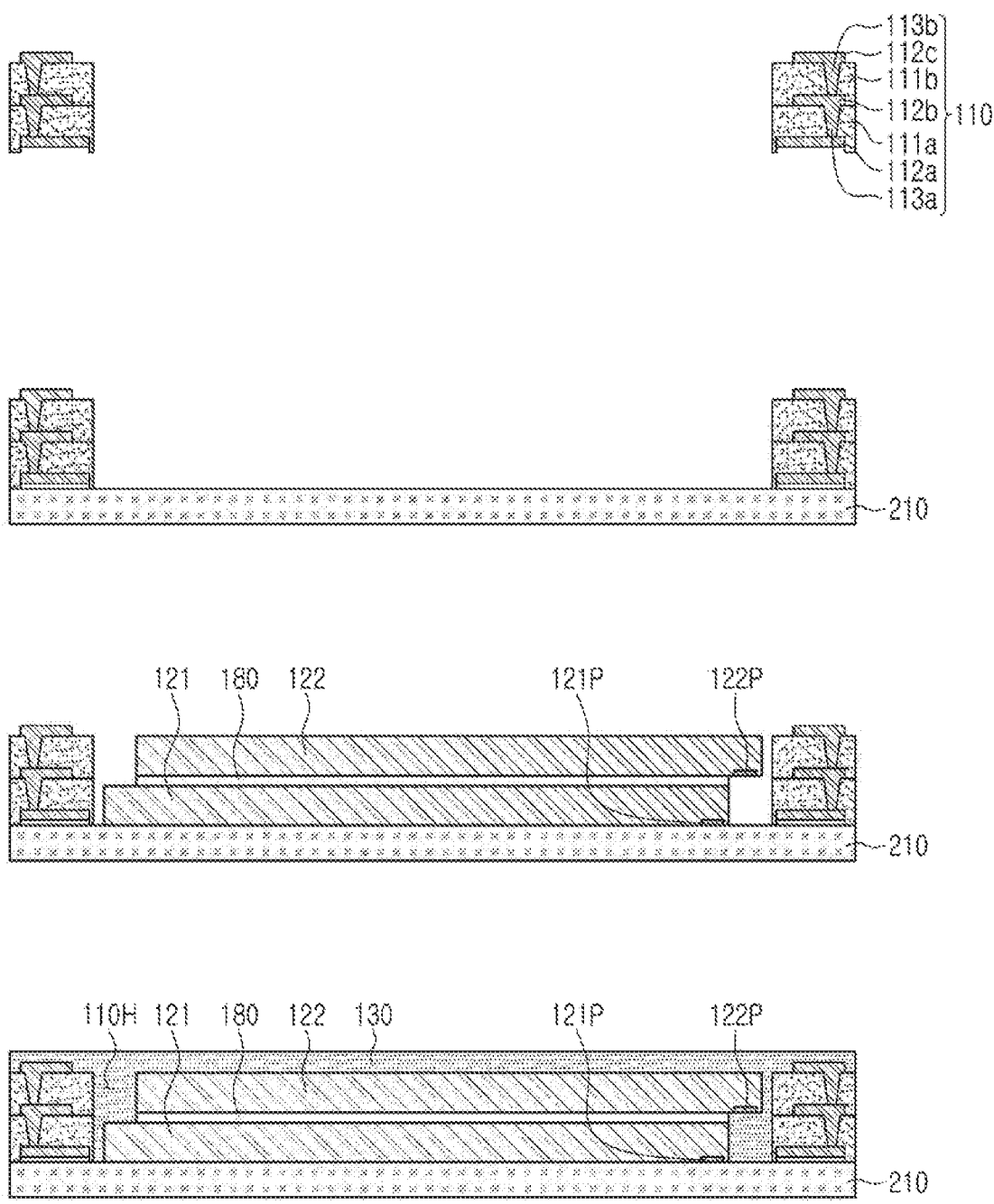
FIGS. 11A through 11D are schematic views illustrating an example of processes of manufacturing the fan-out semiconductor package of FIG. 9.

Referring to FIG. 11A, the first connection member 110 having the through-hole 110H may be prepared. The first connection member 110 may be prepared, for example, by preparing a carrier film having a metal layer formed on one surface or opposite surfaces thereof, forming the first redistribution layer 112a using the metal layer as a seed layer, forming the first insulating layer 111a covering the first redistribution layer 112a on the metal layer, forming the second redistribution layer 112b on the first insulating layer 111a, forming the second insulating layer 111b covering the second redistribution layer 112b on the first insulating layer 111a, forming the third redistribution layer 112c on the second insulating layer 111b to form the first connection member 110, separating the first connection member 110 from the carrier film, and then removing the metal layer remaining on the first redistribution layer 112a. When the metal layer is removed, a recessed portion may be formed in the first connection member 110. The redistribution layers 112a, 112b, and 112c may be formed by performing patterning using a dry film, or the like, and filling patterns by a known plating process. The insulating layers 111a and 111b may be formed by a known lamination method or by an applying and hardening method. Then, an adhesive film 210 may be attached to one surface of the first connection member 110. Any material that may fix the first connection member 110 may be used as the adhesive film 210. As a non-restrictive example, the known tape, or the like, may be used. An example of the known tape may include a thermosetting adhesive tape of which adhesion is weakened by heat treatment, an ultraviolet-curable adhesive tape of which adhesion is weakened by ultraviolet ray irradiation, or the like. Then, the stacked semiconductor chips 121 and 122 may be disposed in the through-hole 110H of the first connection member 110. For example, the stacked semiconductor chips 121 and 122 may be disposed by a method of attaching the stacked semiconductor chips 121 and 122 to the adhesive film 200 in the through-hole 110H. The stacked semiconductor chips 121 and 122 may be disposed in a face-down form, so that the active surfaces thereof on which the connection pads 121P and 122P are disposed, are attached to the adhesive film 210. Then, at least portions of the first connection member 110 and the semiconductor chips 121 and 122 may be encapsulated using the encapsulant 130. The encapsulant 130 may encapsulate at least portions of the first connection member 110 and the inactive surfaces of the semiconductor chips 121 and 122, and may fill at least portions of a space in the through-hole 110H. The encapsulant 130 may be formed by a known method. For example, the encapsulant 130 may be formed by a method of laminating a precursor of the encapsulant 130 and then hardening the precursor. Alternatively, the encapsulant 130 may be formed by a method of applying a pre-encapsulant to the adhesive film 210, to encapsulate the semiconductor chips 121 and 122, or the like, and then hardening the pre-encapsulant.

Figure 11B:
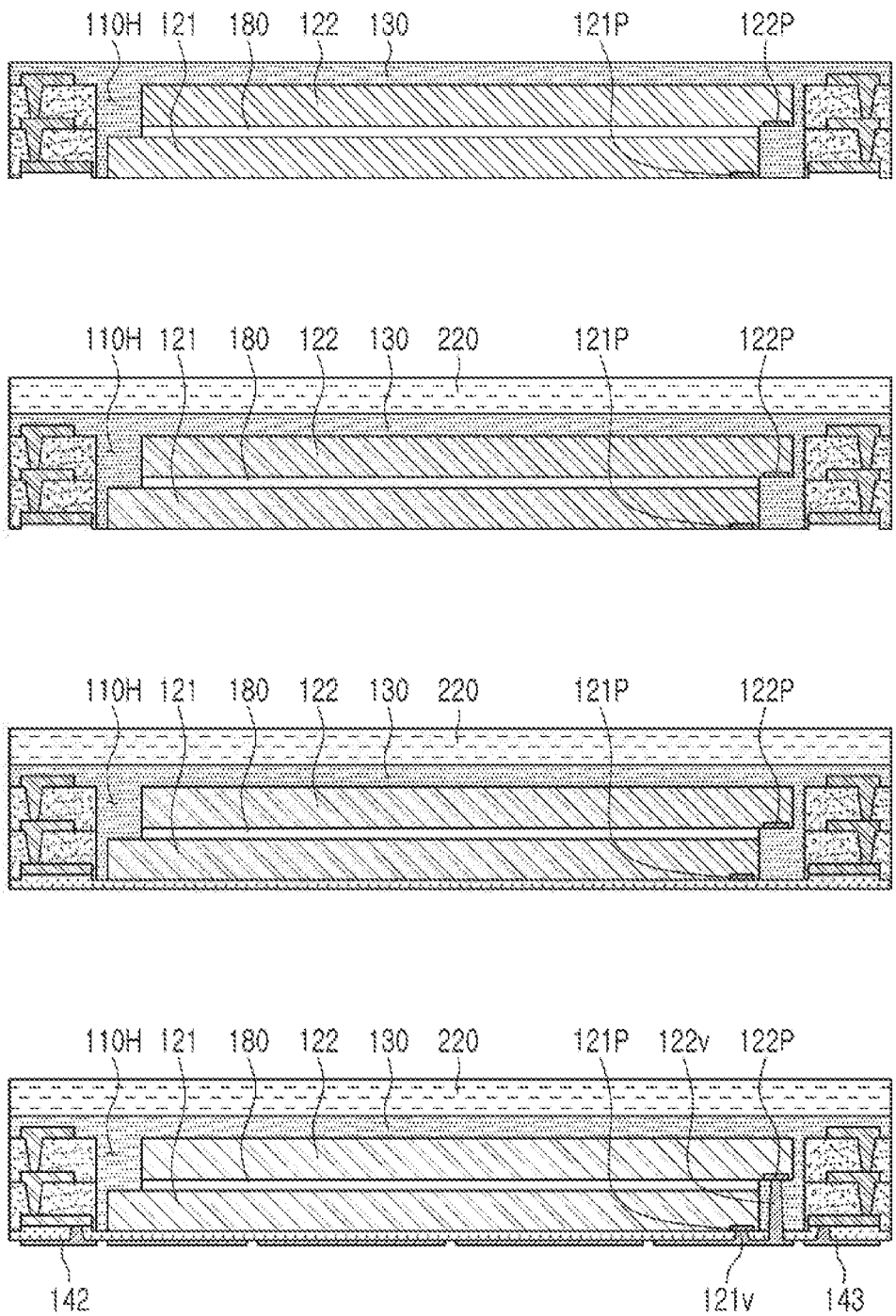

Then, referring to FIG. 11B, the adhesive film 210 may be peeled off. A method of peeling off the adhesive film is not particularly limited, but may be a known method. For example, when the thermosetting adhesive tape of which adhesion is weakened by heat treatment, the ultraviolet-curable adhesive tape, of which adhesion is weakened by ultraviolet ray irradiation, or the like, is used as the adhesive film 210, the adhesive film 210 may be peeled off after the adhesion of the adhesive film 210 is weakened by heat-treating the adhesive film 210 or may be peeled off after the adhesion of the adhesive film 210 is weakened by irradiating an ultraviolet ray to the adhesive film 210. Then, a detachable film 220 may be attached to the encapsulant 130, if necessary. A material, or the like, of the detachable film 220 is not particularly limited. Then, the insulating layer 141 may be formed in a region in which the adhesive film 210 is removed. The insulating layer 141 may be formed by a lamination method or an application method, using the insulating material as described above. Then, the redistribution layer 142 and the vias 143 may be formed. In addition, the multi-stage conductors 121v and 122v may be formed. The vias 143 and the multi-stage conductors 121v and 122v may be formed by forming holes using an exposure and development method, a laser drill, or the like, and then performing plating by the known plating process such as a subtractive process, an additive process, a semi-additive process (SAP), a modified semi-additive process (MSAP), or the like, respectively. The redistribution layer 142 may also be formed by the known plating process described above. The second connection member 140 may be formed on the first connection member 110 and the active surfaces of the plurality of semiconductor chips 121 and 122, through a series of processes.

Figure 11C:
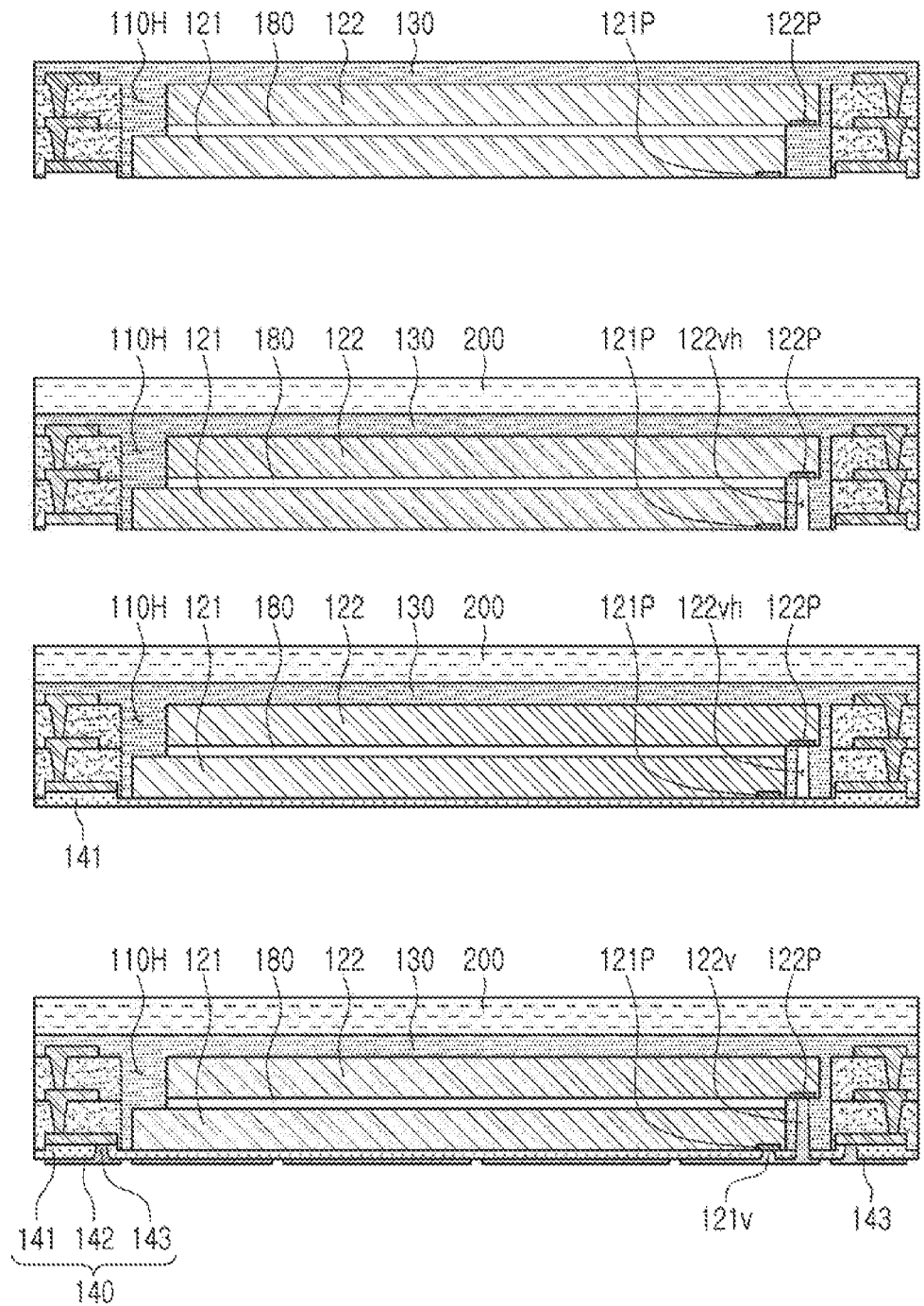

Referring to FIG. 11C, holes 122vh for the second conductors 122v penetrating through the encapsulant 130 among the multi-stage conductors 121v and 122v may also be formed before the insulating layer 141 is formed. That is, the second connection member 140 and the multi-stage conductors 121v and 122v may be formed by peeling off the adhesive film 210, attaching the detachable film 220, forming holes 122vh for the second conductors 122v, forming the insulating layer 141, forming holes for the vias 143 and the multi-stage conductors 121v and 122v in the insulating layer 141, and then performing a plating process.

Figure 11D:
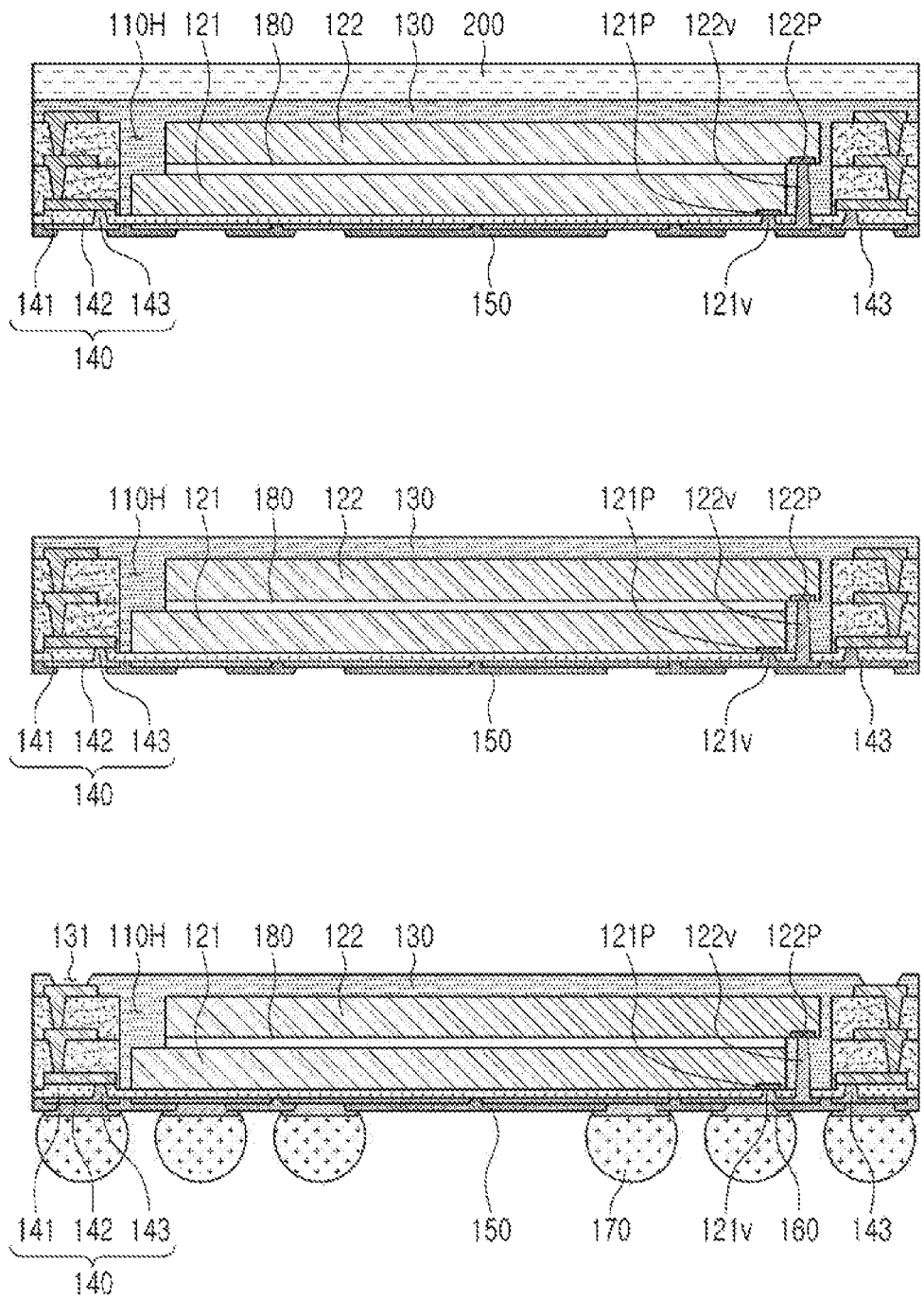

Referring to FIG. 11D, then, the passivation layer 150 may be formed on the second connection member 140. The passivation layer 150 may also be formed by a method of laminating a precursor of the passivation layer 150 and then hardening the precursor, a method of applying a material for forming the passivation layer 150 and then hardening the material, or the like. The openings 151 may be formed in the passivation layer 150 to expose at least portions of the redistribution layer 142 of the second connection member 140, and the underbump metal layer 160 may be formed in the openings 151 by the known metallization method. The connection terminals 170 may be formed on the underbump metal layer 160, if necessary. A method of forming the connection terminals 170 is not particularly limited. That is, the connection terminals 170 may be formed by a method well-known in the related art depending on their structures or forms. The connection terminals 170 may be fixed by reflow, and portions of the connection terminals 170 may be embedded in the passivation layer 150 in order to enhance fixing force, and the remaining portions of the connection terminals 170 may be externally exposed, such that reliability may be improved. In addition, openings 131 penetrating through the encapsulant 130 and exposing at least portions of the third redistribution layer 112c of the first connection member 110 may be formed.

Meanwhile, a series of processes may be processes of preparing the carrier film having a large size, manufacturing a plurality of fan-out semiconductor packages, and then singulating the plurality of fan-out semiconductor packages into individual fan-out semiconductor packages through a sawing process, in order to facilitate mass production. In this case, productivity may be excellent.

Figure 12:
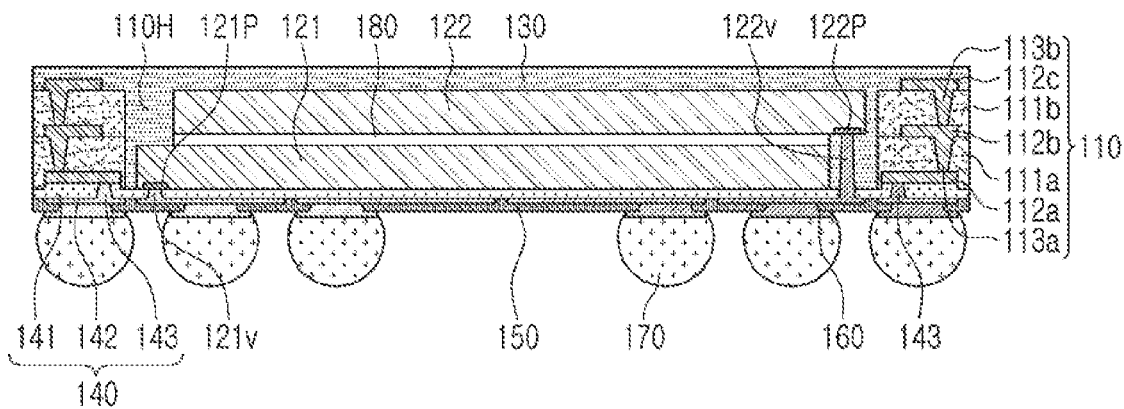
FIG. 12 is a schematic cross-sectional view illustrating another example of a fan-out semiconductor package.

FIG. 12 is a schematic cross-sectional view illustrating another example of a fan-out semiconductor package.

Referring to the drawing, in a fan-out semiconductor package 100B according to another exemplary embodiment in the present disclosure, first connection pads 121P of a first semiconductor chip 121 and second connection pads 122P of a second semiconductor chip 122 may be disposed to oppose each other in a horizontal direction, unlike the fan-out semiconductor package 100A illustrated in FIG. 9. That is, the first connection pads 121P of the first semiconductor chip 121 may be disposed on a mismatched side portion of the left portion of an active surface of the first semiconductor chip 121 in the drawing, and the second connection pads 122P of the second semiconductor chip 122 may be disposed on a mismatched side portion of the right portion of an active surface of the second semiconductor chip 122 in the drawing. Descriptions of configurations and manufacturing methods overlapping those provided above will be omitted hereinafter.

Figure 13:
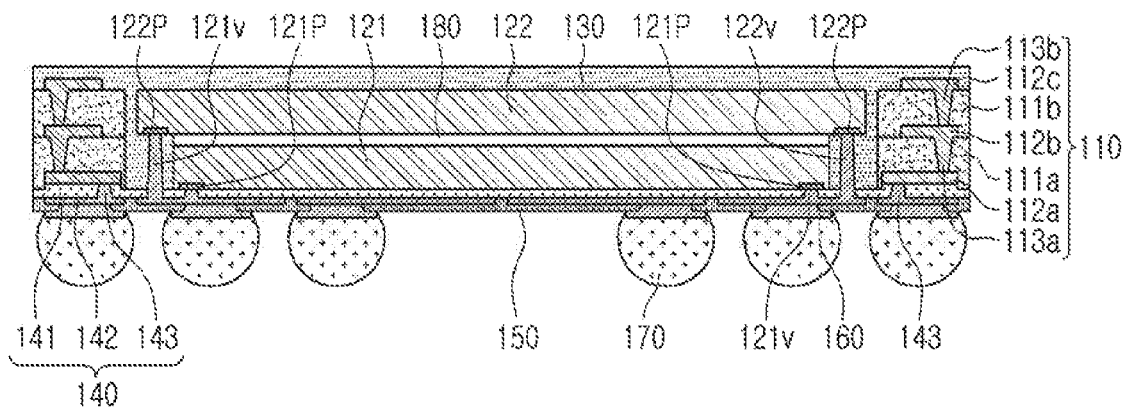
FIG. 13 is a schematic cross-sectional view illustrating another example of a fan-out semiconductor package.

FIG. 13 is a schematic cross-sectional view illustrating another example of a fan-out semiconductor package.

Referring to the drawing, in a fan-out semiconductor package 100C according to another exemplary embodiment in the present disclosure, a horizontal cross-sectional area of a second semiconductor chip 122 may be greater than that of a first semiconductor chip 121, unlike the fan-out semiconductor package 100A illustrated in FIG. 9. That is, an active surface of the second semiconductor chip 122 may be wider than an inactive surface of the first semiconductor chip 121. In this case, the active surface of the second semiconductor chip 122 may include a first side portion being at least partially off of the inactive surface of the first semiconductor chip 121, a central portion facing the inactive surface of the first semiconductor chip 121, and a second side portion, symmetrical to the first side portion, in relation to the central portion and being at least partially off of the inactive surface of the first semiconductor chip 121, and second connection pads 122P may be disposed on both the first and second side portions of the active surface of the second semiconductor chip 122. That is, the semiconductor chips 121 and 122 may be disposed to be mismatched to each other such that they have different horizontal cross-sectional areas, and the second connection pads 122P may be disposed on the first and second side portions of the active surface of the second semiconductor chip 122, such that multi-stage conductors 121v and 122v may be applied. Descriptions of configurations and manufacturing methods overlapping those provided above will be omitted hereinafter.

Figure 14:
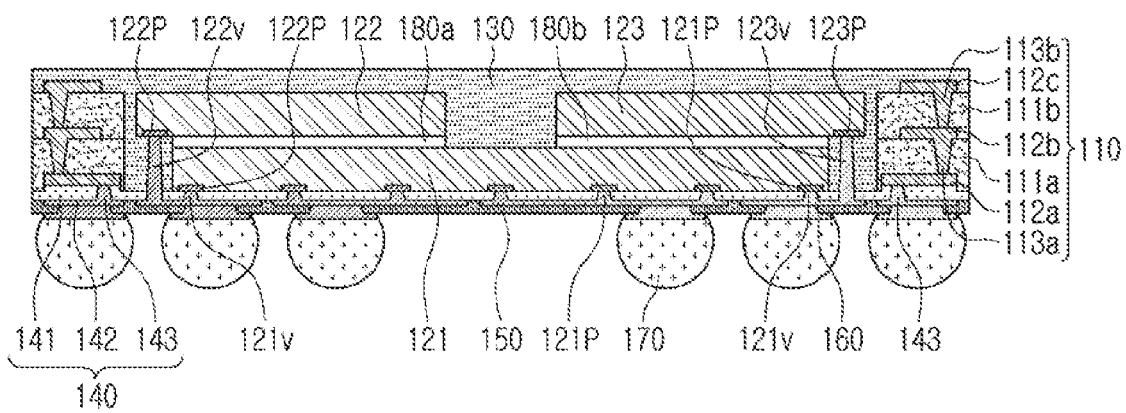
FIG. 14 is a schematic cross-sectional view illustrating another example of a fan-out semiconductor package.

FIG. 14 is a schematic cross-sectional view illustrating another example of a fan-out semiconductor package.

Referring to the drawing, a fan-out semiconductor package 100D according to another exemplary embodiment in the present disclosure may further include a third semiconductor chip 123 disposed side by side with a second semiconductor chip 122 on a first semiconductor chip 121 in a through-hole 110H, and having an active surface having third connection pads 123P disposed thereon and an inactive surface opposing the active surface, unlike the fan-out semiconductor package 100A illustrated in FIG. 9. The active surface of the third semiconductor chip 123 may be attached to an inactive surface of the first semiconductor chip 121, and the third semiconductor chip 123 may be disposed on a side opposite to the second semiconductor chip 122 in the horizontal direction in a kind of step form on the first semiconductor chip 121, to be mismatched to the first semiconductor chip 121 so that the third connection pads 123P are exposed. The second semiconductor chip 122 and the third semiconductor chip 123 may have horizontal cross-sectional areas smaller than that of the first semiconductor chip 121. A redistribution layer 142 of a second connection member 140 may be connected to the third connection pads 123P through third conductors 123v, and heights of second and third conductors 122v and 123v may be the same as each other. A phrase, 'heights are the same as each other,' means that heights are substantially the same as each other, and is a concept including an error in a process. The first semiconductor chip 121 and the second and third semiconductor chips 122 and 123 may be connected to each other through first and second adhesive members 180a and 180b, respectively. Descriptions of configurations and manufacturing methods overlapping those provided above will be omitted hereinafter.

Figure 15:
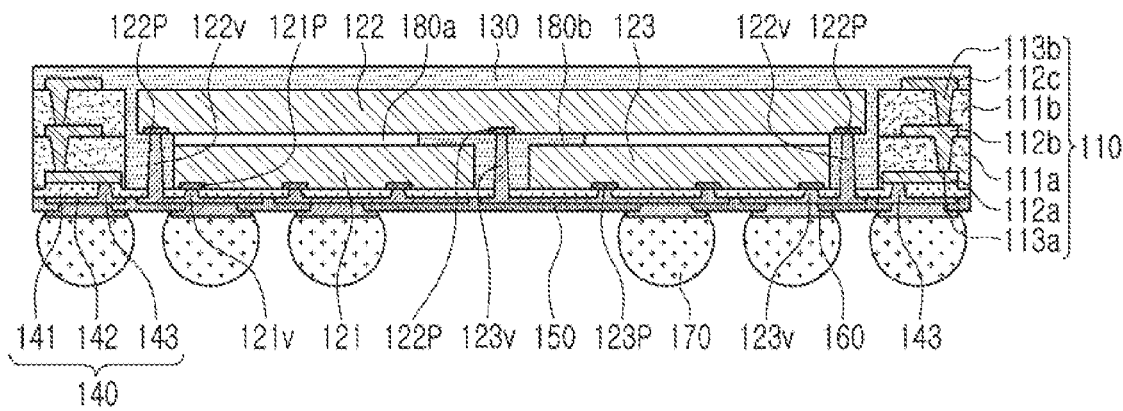
FIG. 15 is a schematic cross-sectional view illustrating another example of a fan-out semiconductor package.

FIG. 15 is a schematic cross-sectional view illustrating another example of a fan-out semiconductor package.

Referring to the drawing, a fan-out semiconductor package 100E according to another exemplary embodiment in the present disclosure may further include a third semiconductor chip 123 disposed side by side with a first semiconductor chip 121 in a through-hole 110H and having an active surface having third connection pads 123P disposed thereon and an inactive surface opposing the active surface, unlike the fan-out semiconductor package 100A illustrated in FIG. 9. An active surface of a second semiconductor chip 122 may be attached to inactive surfaces of the first and third semiconductor chips 121 and 123, and the second semiconductor chip 122 may be disposed on the first and third semiconductor chips 121 and 123, to be mismatched to the first and third semiconductor chips 121 and 123, so that second connection pads 122P are exposed. A redistribution layer 142 of a second connection member 140 may be connected to the third connection pads 123P through third conductors 123v, and heights of first and third conductors 121v and 123v may be the same as each other. A horizontal cross-sectional area of the second semiconductor chip 122 may be greater than those of the first and third semiconductor chips 121 and 123. In this case, the active surface of the second semiconductor chip 122 may include a first side portion being at least partially off of the inactive surface of the first semiconductor chip 121, a central portion being at least partially off of both the inactive surfaces of the first and third semiconductor chips 121 and 123, and a second side portion, symmetrical to the first side portion in relation to the central portion and being at least partially off of the inactive surface of the third semiconductor chip 123, and the second connection pads 122P may be disposed on all of the first and second side portions and the central portion of the active surface of the second semiconductor chip 122. That is, the second semiconductor chip 122 may be disposed to be mismatched to the first and third semiconductor chips 121 and 123 in a form in which it has a horizontal cross-sectional area different from those of the first and third semiconductor chips 121 and 123, and the second connection pads 122P may be disposed on the first and second side portions and the central portion of the active surface of the second semiconductor chip 122. The first and third semiconductor chips 121 and 123 and the second semiconductor chip 122 may be connected to each other through first and second adhesive members 180a and 180b, respectively. Descriptions of configurations and manufacturing methods overlapping those provided above will be omitted hereinafter FIG. 16 is a schematic cross-sectional view illustrating another example of a fan-out semiconductor package.

Referring to the drawing, a fan-out semiconductor package 100F according to another exemplary embodiment in the present disclosure may further include a third semiconductor chip 123 disposed side by side with a first semiconductor chip 121 in a through-hole 110H and having an active surface having third connection pads 123P disposed thereon and an inactive surface opposing the active surface, and a fourth semiconductor chip 124 disposed on the third semiconductor chip 123 in the through-hole 110H and having an active surface having fourth connection pads 124P disposed thereon and an inactive surface opposing the active surface, unlike the fan-out semiconductor package 100A illustrated in FIG. 9. The active surface of the fourth semiconductor chip 124 may be attached to the inactive surface of the third semiconductor chip 123, and the fourth semiconductor chip 124 may be disposed on the third semiconductor chip 123, to be mismatched to the third semiconductor chip 123 in a kind of step form so that the fourth connection pads 124P are exposed. A redistribution layer 142 of a second connection member 140 may be connected to the third and fourth connection pads 123P and 124P through third and fourth conductors 123v and 124v, respectively. The fourth conductor 124v may have a height greater than that of the third conductor 123v. As described above, multi-stage conductors 121v, 122v, 123v, and 124v may be applied even in a structure in which the semiconductor chips 121, 122, 123, and 124 are connected to each other in a two-stage parallel form. The first and second semiconductor chips 121 and 122 and the third and fourth semiconductor chips 123 and 124 may be connected to each other through first and second adhesive members 180a and 180b, respectively. Descriptions of configurations and manufacturing methods overlapping those provided above will be omitted hereinafter.

Figure 17:
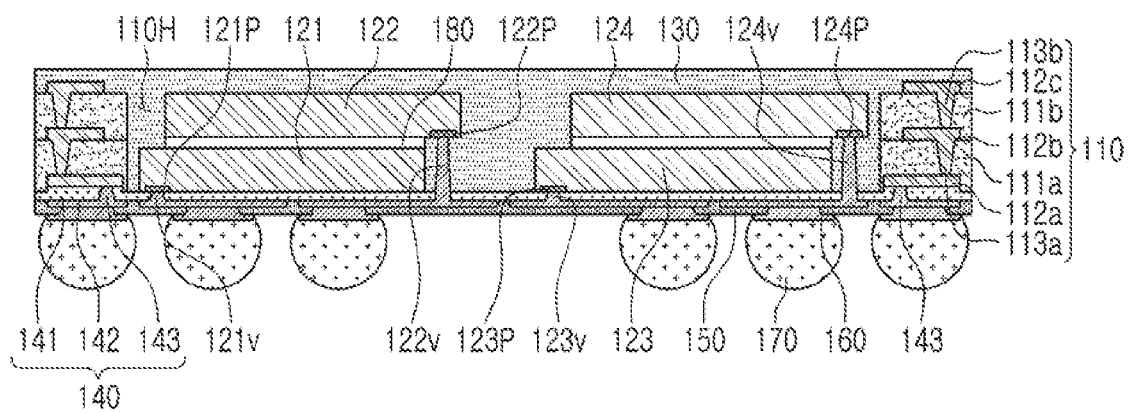
FIG. 17 is a schematic cross-sectional view illustrating another example of a fan-out semiconductor package.

FIG. 17 is a schematic cross-sectional view illustrating another example of a fan-out semiconductor package.

Figure 16:
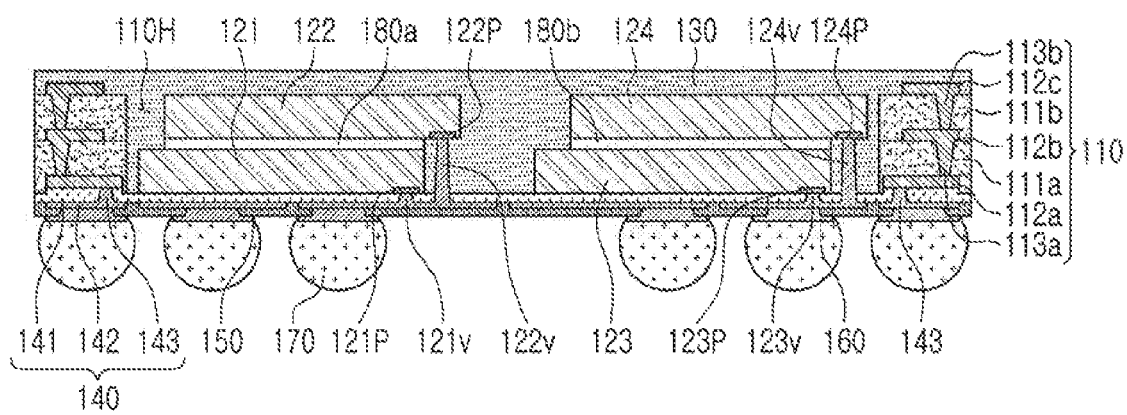
FIG. 16 is a schematic cross-sectional view illustrating another example of a fan-out semiconductor package.

Referring to the drawing, in a fan-out semiconductor package 100G according to another exemplary embodiment in the present disclosure, semiconductor chips 121, 122, 123, and 124 may be connected to each other in a two-stage parallel form, similar to the form illustrated in FIG. 16. However, first connection pads 121P of the first semiconductor chip 121 and second connection pads 122P of the second semiconductor chip 122 may be disposed to oppose each other in a horizontal direction. In addition, third connection pads 123P of the third semiconductor chip 123 and fourth connection pads 124P of the fourth semiconductor chip 124 may be disposed to oppose each other in the horizontal direction. That is, in the drawing, the first connection pads 121P of the first semiconductor chip 121 may be disposed on a mismatched side portion of the left portion of an active surface of the first semiconductor chip 121, and the second connection pads 122P of the second semiconductor chip 122 may be disposed on a mismatched side portion of the right portion of an active surface of the second semiconductor chip 122 in the drawing. In addition, the third connection pads 123P of the third semiconductor chip 123 may be disposed on a mismatched side portion of the left portion of an active surface of the third semiconductor chip 123 in the drawing, and the fourth connection pads 124P of the fourth semiconductor chip 124 may be disposed on a mismatched side portion of the right portion of an active surface of the fourth semiconductor chip 124 in the drawing. Descriptions of configurations and manufacturing methods overlapping those provided above will be omitted hereinafter.

Figure 18:
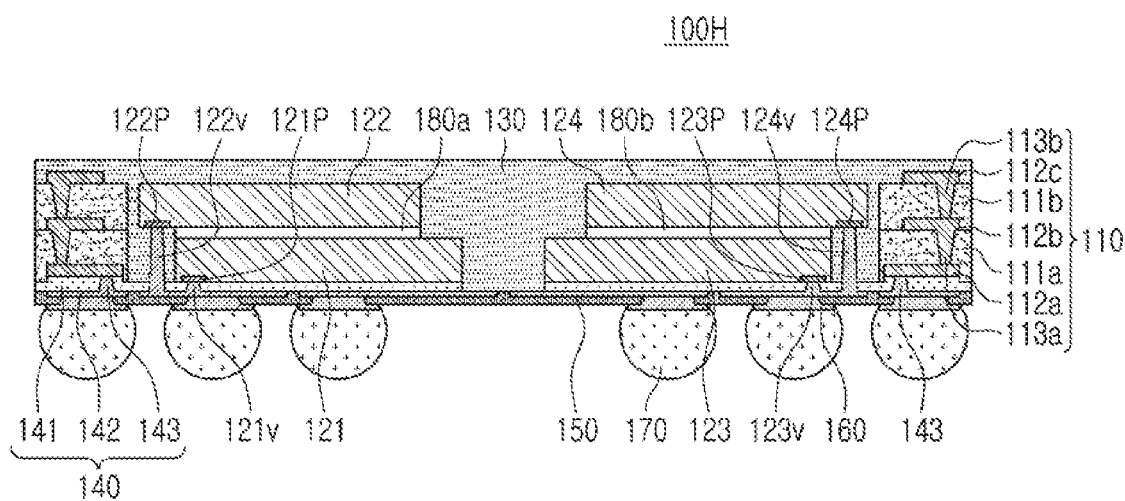
FIG. 18 is a schematic cross-sectional view illustrating another example of a fan-out semiconductor package.

FIG. 18 is a schematic cross-sectional view illustrating another example of a fan-out semiconductor package.

Referring to the drawing, in a fan-out semiconductor package 100H according to another exemplary embodiment in the present disclosure, semiconductor chips 121, 122, 123, and 124 may be connected to each other in a two-stage parallel form, similar to the form illustrated in FIG. 16. However, second connection pads 122P of the second semiconductor chip 122 may be disposed on a mismatched side portion of the left portion of an active surface of the second semiconductor chip 122 in the drawing, and fourth connection pads 124P of the fourth semiconductor chip 124 may be disposed on a mismatched side portion of the right portion of an active surface of the fourth semiconductor chip 124 in the drawing. That is, mismatched portions of multi-stage conductors 121v and 122v of the first and second semiconductor chips 121 and 122 and mismatched portions of multi-stage conductors 123v and 124v of the third and fourth semiconductor chips 123 and 124 may be disposed to oppose each other in the horizontal direction of the fan-out semiconductor package 100H. Descriptions of configurations and manufacturing methods overlapping those provided above will be omitted hereinafter.

Figure 19:
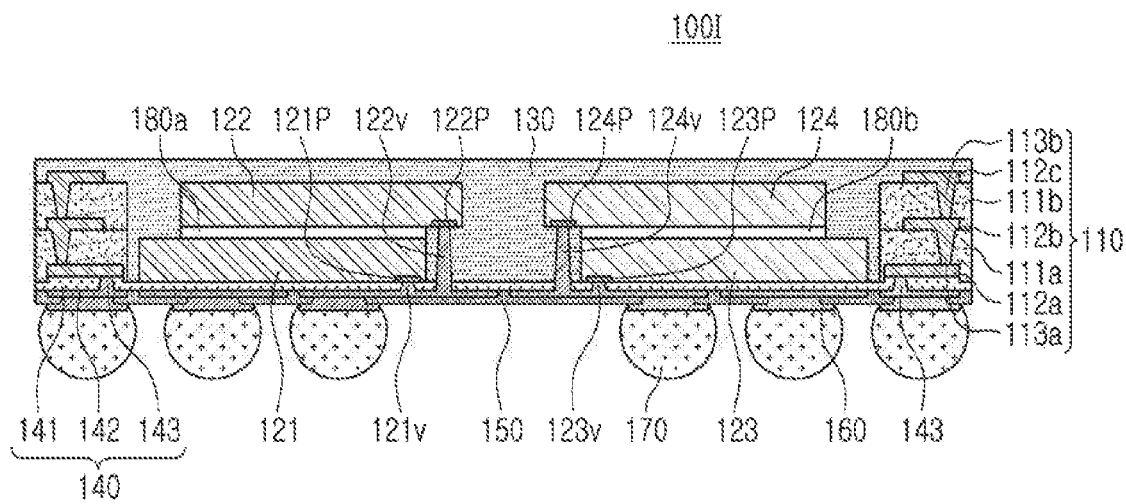
FIG. 19 is a schematic cross-sectional view illustrating another example of a fan-out semiconductor package.

FIG. 19 is a schematic cross-sectional view illustrating another example of a fan-out semiconductor package.

Referring to the drawing, in a fan-out semiconductor package 100I according to another exemplary embodiment in the present disclosure, semiconductor chips 121, 122, 123, and 124 may be connected to each other in a two-stage parallel form, similar to the form illustrated in FIG. 16. However, second connection pads 122P of the second semiconductor chip 122 may be disposed on a mismatched side portion of the right portion of an active surface of the second semiconductor chip 122 in the drawing, and fourth connection pads 124P of the fourth semiconductor chip 124 may be disposed on a mismatched side portion of the left portion of an active surface of the fourth semiconductor chip 124 in the drawing. That is, mismatched portions of multi-stage conductors 121v and 122v of the first and second semiconductor chips 121 and 122 and mismatched portions of multi-stage conductors 123v and 124v of the third and fourth semiconductor chips 123 and 124 may be disposed to face each other. Descriptions of configurations and manufacturing methods overlapping those provided above will be omitted hereinafter.

Figure 20:
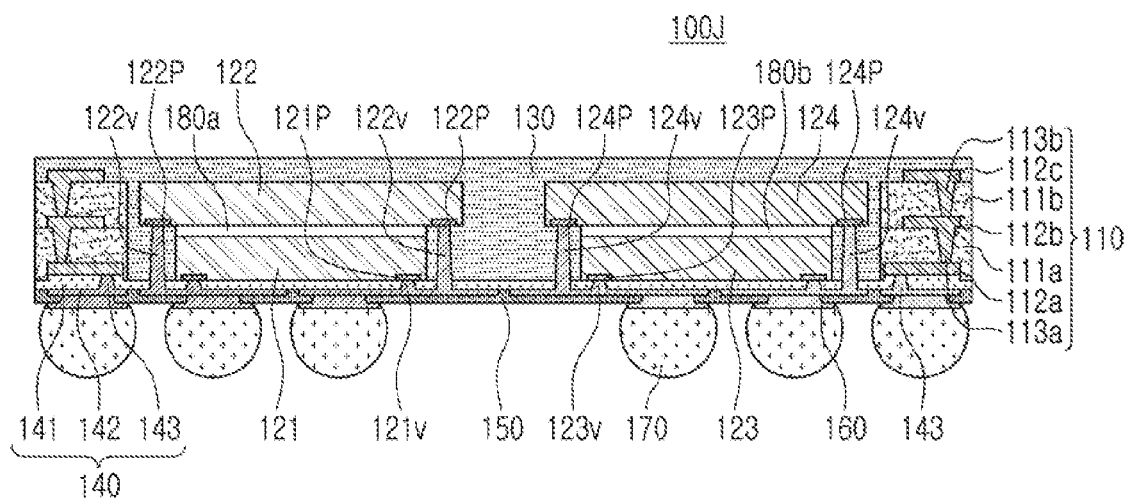
FIG. 20 is a schematic cross-sectional view illustrating another example of a fan-out semiconductor package.

FIG. 20 is a schematic cross-sectional view illustrating another example of a fan-out semiconductor package.

Referring to the drawing, in a fan-out semiconductor package 100J according to another exemplary embodiment in the present disclosure, semiconductor chips 121, 122, 123, and 124 may be connected to each other in a two-stage parallel form, similar to the form illustrated in FIG. 16. However, a horizontal cross-sectional area of the second semiconductor chip 122 may be wider than that of the first semiconductor chip 121. In addition, a horizontal cross-sectional area of the fourth semiconductor chip 124 may be wider than that of the third semiconductor chip 123. That is, an active surface of the second semiconductor chip 122 may be wider than an inactive surface of the first semiconductor chip 121. In addition, an active surface of the fourth semiconductor chip 124 may be wider than an inactive surface of the third semiconductor chip 123. That is, the stacked semiconductor chips 121, 122, 123, and 124 may be disposed to be mismatched to each other, in a form in which they have different horizontal cross-section areas, in a two-stage parallel structure, respectively. Descriptions of configurations and manufacturing methods overlapping those provided above will be omitted hereinafter.

Figure 21:
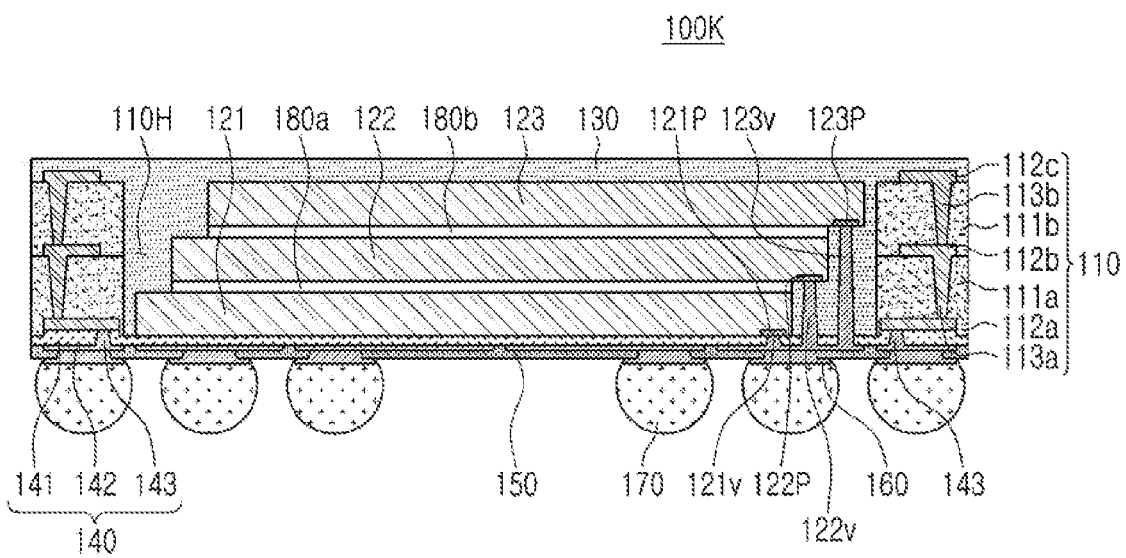
FIG. 21 is a schematic cross-sectional view illustrating another example of a fan-out semiconductor package.

FIG. 21 is a schematic cross-sectional view illustrating another example of a fan-out semiconductor package.

Referring to the drawing, a fan-out semiconductor package 100K according to another exemplary embodiment in the present disclosure may further include a third semiconductor chip 123 disposed on a second semiconductor chip 122 in a through-hole 110H and having an active surface having third connection pads 123P disposed thereon and an inactive surface opposing the active surface, unlike the fan-out semiconductor package 100A illustrated in FIG. 9. The active surface of the third semiconductor chip 123 may be attached to an inactive surface of the second semiconductor chip 122, and the third semiconductor chip 123 may be disposed on the second semiconductor chip 122, to be mismatched to the second semiconductor chip 122 in a step form so that the third connection pads 123P are exposed. A redistribution layer 142 of a second connection member 140 may be connected to the third connection pads 123P through third conductors 123v. The third conductor 123v may have a height greater than those of first and second conductors 121v and 122v. That is, even in a case in which the semiconductor chips 121, 122, and 123 are stacked in a three-stage stack, multi-stage conductors 121v, 122v, and 123v may be applied. The first and third semiconductor chips 121 and 123 and the second semiconductor chip 122 may be connected to each other through first and second adhesive members 180a and 180b, respectively. Descriptions of configurations and manufacturing methods overlapping those provided above will be omitted hereinafter.

Figure 22:
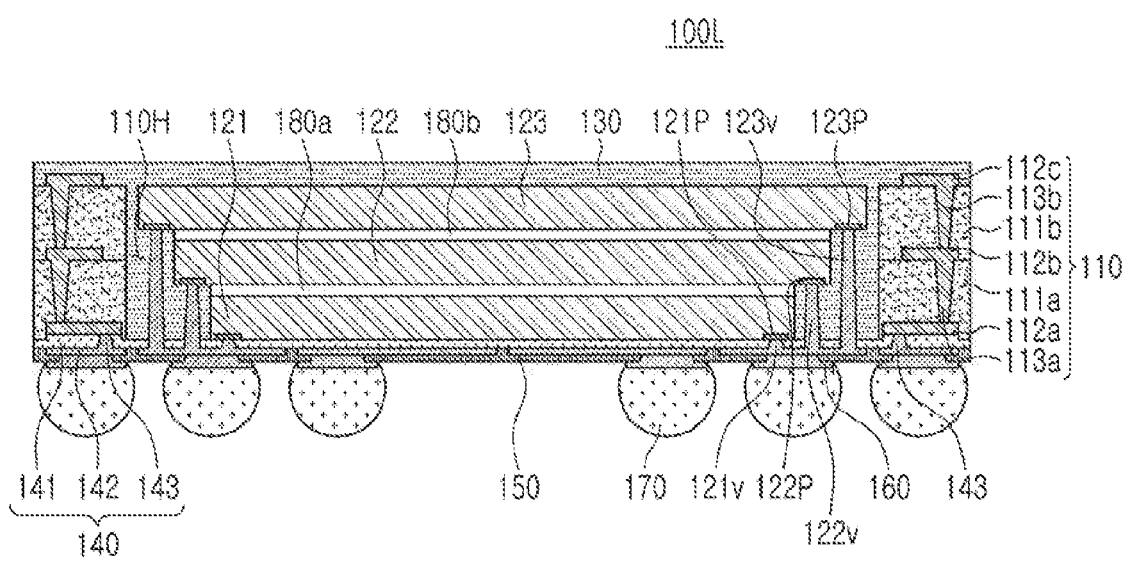
FIG. 22 is a schematic cross-sectional view illustrating another example of a fan-out semiconductor package.

FIG. 22 is a schematic cross-sectional view illustrating another example of a fan-out semiconductor package.

Referring to the drawing, in a fan-out semiconductor package 100L according to another exemplary embodiment in the present disclosure, semiconductor chips 121, 122, and 123, may be connected to each other in a three-stage parallel form, similar to the form illustrated in FIG. 21. However, a horizontal cross-sectional area of the second semiconductor chip 122 may be wider than that of the first semiconductor chip 121. In addition, a horizontal cross-sectional area of the third semiconductor chip 123 may be wider than that of the second semiconductor chip 122. That is, multi-stage conductors 121v, 122v, and 123v may be applied in a scheme in which the semiconductor chips 121, 122, and 123 having different horizontal cross-sectional areas are disposed to be mismatched to each other. Descriptions of configurations and manufacturing methods overlapping those provided above will be omitted hereinafter.

Figure 23:
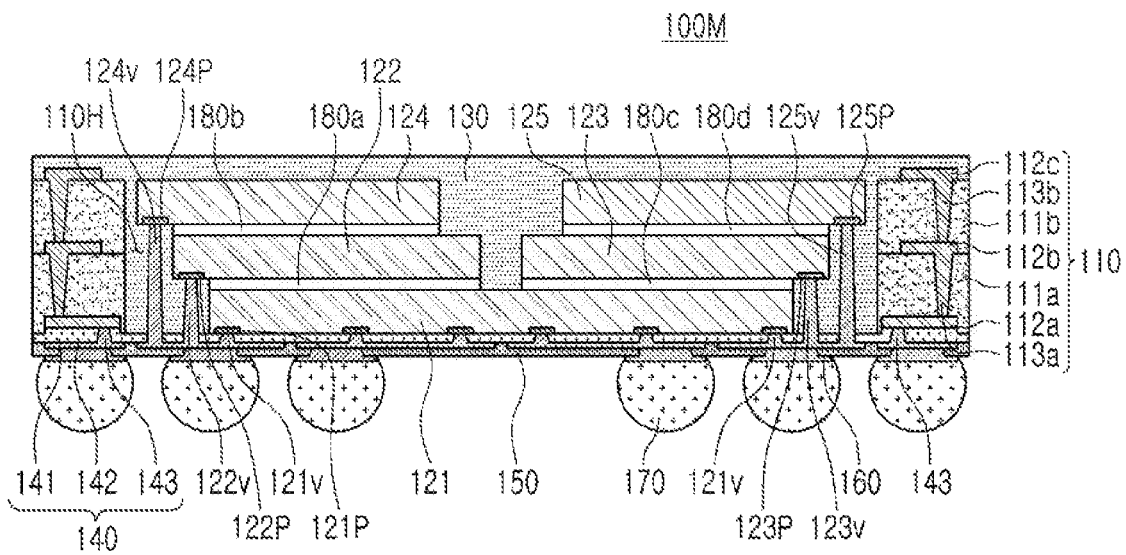
FIG. 23 is a schematic cross-sectional view illustrating another example of a fan-out semiconductor package.

FIG. 23 is a schematic cross-sectional view illustrating another example of a fan-out semiconductor package.

Referring to the drawing, a fan-out semiconductor package 100M according to another exemplary embodiment in the present disclosure may further include a fourth semiconductor chip 124 disposed on a second semiconductor chip 122 in a through-hole 110H and having an active surface having fourth connection pads 124P disposed thereon and an inactive surface opposing the active surface, and a fifth semiconductor chip 125 disposed on a third semiconductor chip 123 in through-hole 110H and having an active surface having fifth connection pads 125P disposed thereon and an inactive surface opposing the active surface, unlike the fan-out semiconductor package 100D illustrated in FIG. 14. The active surface of the fourth semiconductor chip 124 may be attached to an inactive surface of the second semiconductor chip 122, and the fourth semiconductor chip 124 may be disposed on the second semiconductor chip 122, to be mismatched to the second semiconductor chip 122 so that the fourth connection pads 124P are exposed. The active surface of the fifth semiconductor chip 125 may be attached to an inactive surface of the third semiconductor chip 123, and the fifth semiconductor chip 125 may be disposed on the third semiconductor chip 123, to be mismatched to the third semiconductor chip 123 so that the fifth connection pads 125P are exposed. A redistribution layer 142 of a second connection member 140 may be connected to the fourth and fifth connection pads 124P and 125P through fourth and fifth conductors 124v and 125v, respectively. The fourth and fifth conductors 124v and 125v may have heights greater than those of the second and third conductors 122v and 123v. The first to fifth semiconductor chips 121 to 125 may be connected to each other through first to fourth adhesive members 180a, 180b, 180c, and 180d. Descriptions of configurations and manufacturing methods overlapping those provided above will be omitted hereinafter.

Figure 24:
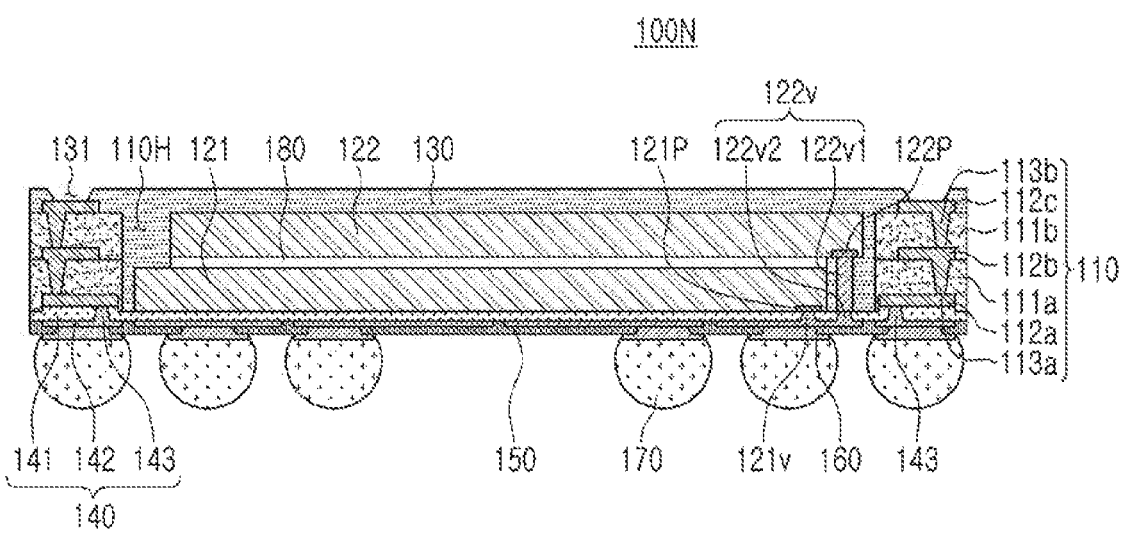
FIG. 24 is a schematic cross-sectional view illustrating another example of a fan-out semiconductor package.

FIG. 24 is a schematic cross-sectional view illustrating another example of a fan-out semiconductor package.

Referring to the drawing, in a fan-out semiconductor package 100N according to another exemplary embodiment in the present disclosure, second conductors 122v may include metal posts 122v1 connected to second connection pads 122P and vias 122v2 connected to a redistribution layer 142 of a second connection member 140, unlike the fan-out semiconductor package 100A illustrated in FIG. 9. The metal post 122v1 may be embedded in an encapsulant 130, and may have a height greater than a thickness of a first semiconductor chip 121. The via 122v2 may penetrate through an insulating layer 141 of the second connection member 140, and may have a height equal to or smaller than that of a first conductor 121v. The metal post 122v1 and the via 122v2 may be connected to each other. The metal post 122v1 may be formed before the encapsulant 130 is formed. The metal post 122v1 may be, for example, a copper post, but is not limited thereto.

Descriptions of configurations and manufacturing methods overlapping those provided above will be omitted hereinafter. Meanwhile, the features of the fan-out semiconductor packages 100B to 100M described above, that is, various stack forms of the semiconductor chips, may be introduced into the structure of the fan-out semiconductor package 100N described above.

Figure 25:
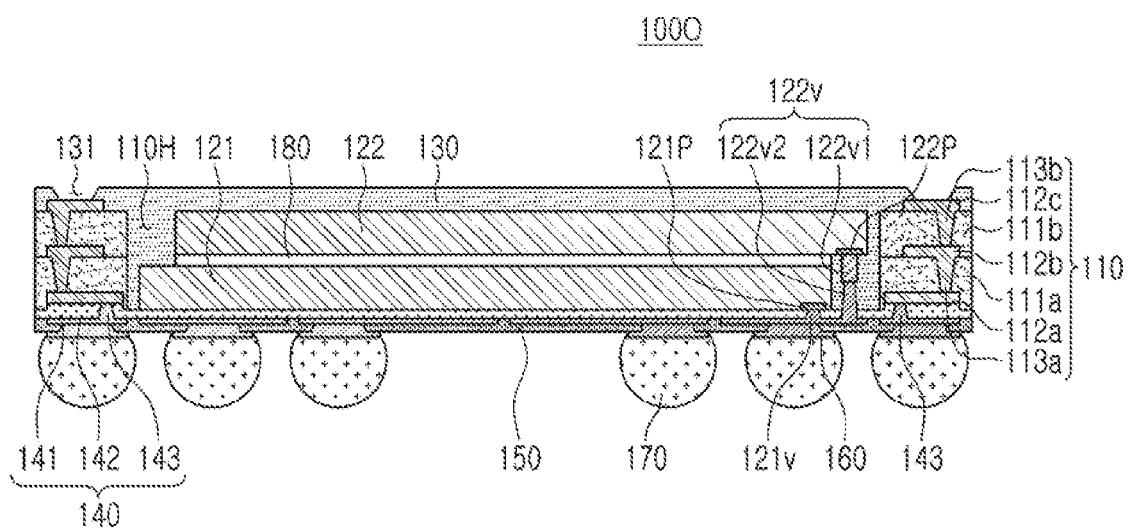
FIG. 25 is a schematic cross-sectional view illustrating another example of a fan-out semiconductor package.

FIG. 25 is a schematic cross-sectional view illustrating another example of a fan-out semiconductor package.

Referring to the drawing, in a fan-out semiconductor package 100O according to another exemplary embodiment in the present disclosure, second conductors 122v may include metal posts 122v1 connected to second connection pads 122P, and vias 122v2 connected to a redistribution layer 142 of a second connection member 140, similar to the fan-out semiconductor package 100N illustrated in FIG. 24. However, the metal post 122v1 may be embedded in an encapsulant 130, and may have a height shorter than a thickness of a first semiconductor chip 121. Therefore, the via 122v2 in contact with the metal post 122v1 may penetrate through an insulating layer 141 of a second connection member 140, and may also penetrate through the encapsulant 130. That is, the via 122v2 may have a height greater than that of a first conductor 121v1.

Descriptions of configurations and manufacturing methods overlapping those provided above will be omitted hereinafter. Meanwhile, the features of the fan-out semiconductor packages 100B to 100M described above, that is, various stack forms of the semiconductor chips, may be introduced into the structure of the fan-out semiconductor package 100O described above.

Figure 26:
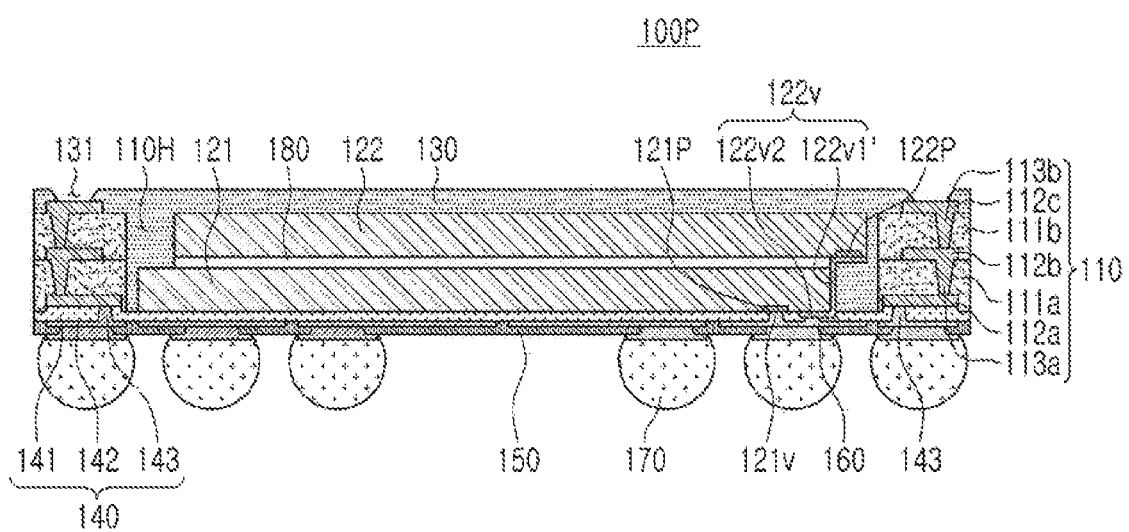
FIG. 26 is a schematic cross-sectional view illustrating another example of a fan-out semiconductor package.

FIG. 26 is a schematic cross-sectional view illustrating another example of a fan-out semiconductor package.

Referring to the drawing, in a fan-out semiconductor package 100P according to another exemplary embodiment in the present disclosure, second conductors 122v may include metal pastes 122v1', connected to second connection pads 122P and extending to side surfaces of a first semiconductor chip 121 and vias 122v2, in contact with a redistribution layer 142 of a second connection member 140, unlike the fan-out semiconductor package 100A illustrated in FIG. 9. The metal pastes 122v1' may extend to an active surface of the first semiconductor chip 121, and may be connected to the vias 122v2 in the extending portions. That is, a portion of the metal pastes 122v1' may be embedded in an encapsulant 130, and the other portion thereof may be embedded in an insulating layer 141 of the second connection member 140. The via 122v2 may penetrate through the insulating layer 141 of the second connection member 140, and may have a height shorter than that of a first conductor 121v. The metal pastes 122v1' may be formed by attaching the first semiconductor chip 121 and a second semiconductor chip 122 to each other and printing and sintering a paste before disposing the first semiconductor chip 121 and the second semiconductor chip 122, attached to each other in a through-hole 110H of a first connection member 110. The metal paste 122v1' may include one or more metals selected from the group consisting of silver (Ag), copper (Cu), nickel (Ni), aluminum (Al), and the like, and one or more binder resins selected from the group consisting of a cellulose based resin, an acrylic resin, an imide based resin, an epoxy based resin, and the like, but is not limited thereto.

Descriptions of configurations and manufacturing methods overlapping those provided above will be omitted hereinafter. Meanwhile, the features of the fan-out semiconductor packages 100B to 100M described above, that is, various stack forms of the semiconductor chips, may be introduced into the structure of the fan-out semiconductor package 100P described above.

Figure 27:
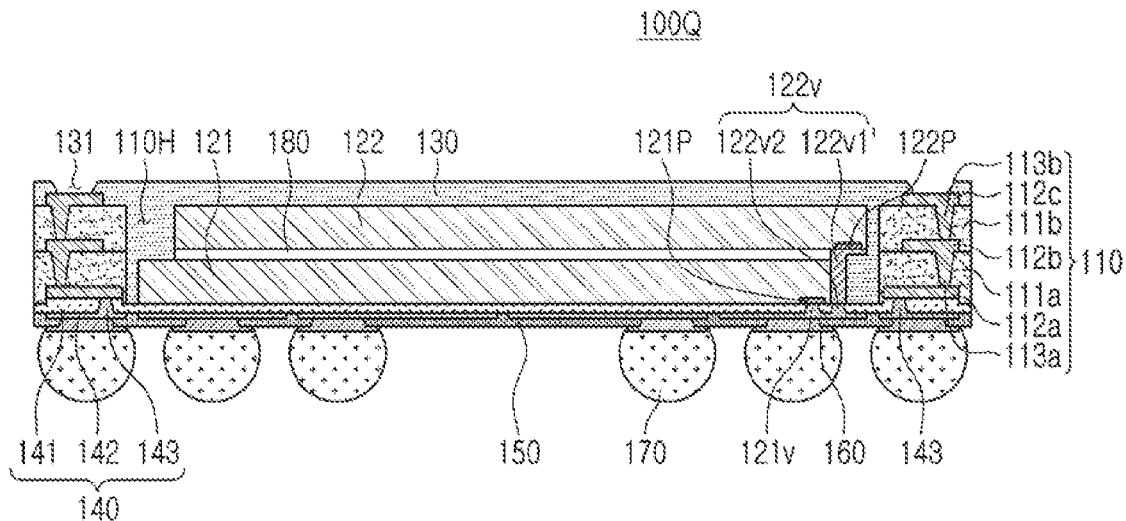
FIG. 27 is a schematic cross-sectional view illustrating another example of a fan-out semiconductor package.

FIG. 27 is a schematic cross-sectional view illustrating another example of a fan-out semiconductor package.

Referring to the drawing, in a fan-out semiconductor package 100Q according to another exemplary embodiment in the present disclosure, second conductors 122v may include metal pastes 122v1' connected to second connection pads 122P and extending to side surfaces of a first semiconductor chip 121 and vias 122v2, connected to a redistribution layer 142 of a second connection member 140, similar to the fan-out semiconductor package 100P illustrated in FIG. 26. However, the metal pastes 122v1' may not extend onto an active surface of the first semiconductor chip 121, and may be in contact with interfaces between vias 122v2 penetrating through an insulating layer 141 of the second connection member 140, and an encapsulant 130 and the second connection member 140. To this end, the metal paste 122v1' of the fan-out semiconductor package 100Q may have a line width greater than that of the metal paste 122v1' of the fan-out semiconductor package 100P. The via 122v2 may have a thickness that is substantially the same as that of the first conductor 121v.

Descriptions of configurations and manufacturing methods overlapping those provided above will be omitted hereinafter. Meanwhile, the features of the fan-out semiconductor packages 100B to 100M described above, that is, various stack forms of the semiconductor chips, may be introduced into the structure of the fan-out semiconductor package 100Q described above.

Figure 28:
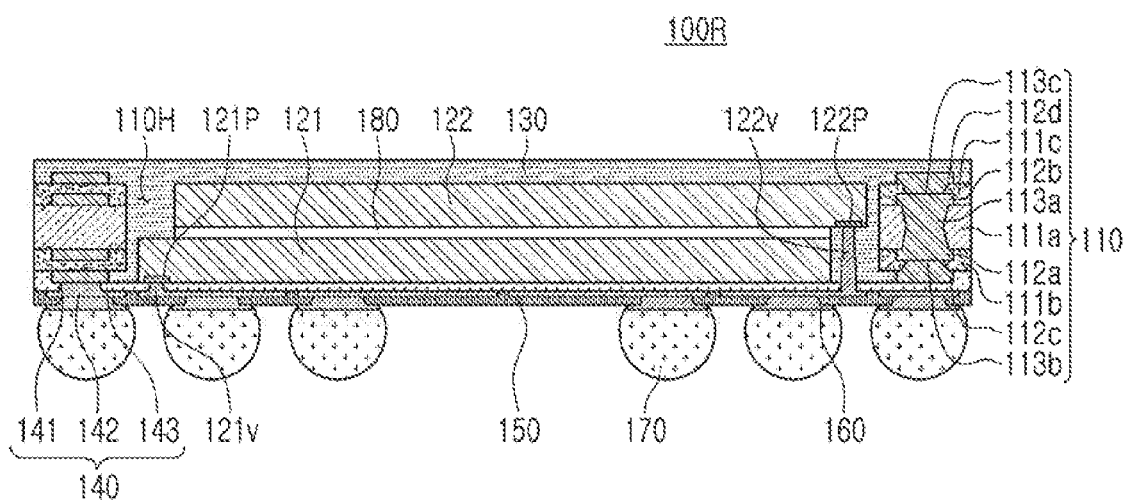
FIG. 28 is a schematic cross-sectional view illustrating another example of a fan-out semiconductor package.

FIG. 28 is a schematic cross-sectional view illustrating another example of a fan-out semiconductor package.

Referring to the drawing, in a fan-out semiconductor package 100R according to another exemplary embodiment in the present disclosure, a first connection member 110 may include a first insulating layer 1/1a, a first redistribution layer 112a and a second redistribution layer 112b disposed on opposite surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c, unlike the fan-out semiconductor package 100A illustrated in FIG. 9. Since the first connection member 110 may include a larger number of redistribution layers 112a, 112b, 112c, and 112d, a second connection member 140 may be further simplified. The first to fourth redistribution layers 112a, 112b, 112c, and 112d may be electrically connected to each other through first to third vias 113a, 113b, and 113c, each penetrating through the first to third insulating layers 111a, 111b, and 111c.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto. Similarly, the first via 113a may have a diameter greater than those of the second via 113b and the third via 113c.

Thicknesses of the redistribution layers 112a, 112b, 112c, and 112d of the first connection member 110 may be greater than that of a redistribution layer 142 of the second connection member 140. Since the first connection member 110 may have a thickness greater than or equal to that of stacked semiconductor chips 121 and 122, the redistribution layers 112a, 112b, 112c, and 112d may also be formed in large sizes. On the other hand, the redistribution layer 142 of the second connection member 140 may be formed in a relatively small size for thinness.

Descriptions of configurations and manufacturing methods overlapping those provided above will be omitted hereinafter. Meanwhile, the features of the fan-out semiconductor packages 100B to 100Q described above, that is, stack forms of the semiconductor chips and several forms of multi-stage conductors, may be introduced into the structure of the fan-out semiconductor package 100R described above.

As set forth above, according to the exemplary embodiments in the present disclosure, a fan-out semiconductor package capable of being thinned and having excellent performance and reliability, in spite of using a plurality of semiconductor chips, may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
a core member having a through-hole;
a first semiconductor chip disposed in the through-hole and having a first active surface having first connection pads disposed thereon;
a second semiconductor chip disposed on the first semiconductor chip in the through-hole and having a second active surface having second connection pads disposed thereon;
an encapsulant encapsulating at least portions of the core member, the first semiconductor chip, and the second semiconductor chip; and
a connection member including a redistribution layer and an insulating layer, the insulating layer having a composition different than that of the encapsulant and having a substantially planar surface that has the core member and the first active surface of the first semiconductor chip disposed thereon and that faces the second active surface of the second semiconductor chip, wherein:
the redistribution layer of the connection member is electrically connected to both the first connection pads and the second connection pads,
the second semiconductor chip is disposed on the first semiconductor chip to be mismatched to the first semiconductor chip so that the second connection pads are exposed,
the redistribution layer of the connection member is connected to the first connection pads and the second connection pads through one or more first conductors and one or more second conductors, respectively,
each second conductor of the one or more second conductors extends integrally from the redistribution layer through the insulating layer of the connection member to the second connection pads, each second conductor has a side surface that contacts the encapsulant from the substantially planar surface of the insulating layer of the connection member on which the first semiconductor chip is disposed to the second connection pads,
each second conductor of the one or more second conductors has a height greater than that of the one or more first conductors,
each second conductor of the one or more second conductors is spaced apart from the core member,
the first semiconductor chip is in contact with the insulating layer of the connection member, and
the second semiconductor chip is disposed on the first semiconductor chip to be mismatched so that at least a portion of a first inactive surface of the first semiconductor chip does not overlap with the second semiconductor chip.

2. The semiconductor package of claim 1, wherein each first conductor of the one or more first conductors is not in contact with the encapsulant, and
each second conductor of the one or more second conductors is in contact with the encapsulant.

3. The semiconductor package of claim 1, wherein the first and second semiconductor chips are memory chips.

4. The semiconductor package of claim 1, wherein the one or more second conductors include one or more metal posts connected to the second connection pads, and one or more vias connected to the redistribution layer of the connection member, and
the one or more metal posts and the one or more vias are connected to each other.

5. The semiconductor package of claim 4, wherein
each metal post has a height greater than a thickness of the first semiconductor chip, and
each via has a height equal to or shorter than that of a first conductor of the one or more first conductors.

6. The semiconductor package of claim 4, wherein
each metal post has a height shorter than a thickness of the first semiconductor chip, and
each via has a height greater than that of a first conductor of the one or more first conductors.

7. The semiconductor package of claim 1, wherein the one or more second conductors include metal pastes connected to the second connection pads and extending to side surfaces of the first semiconductor chip, and vias in contact with the redistribution layer of the connection member, and
the metal pastes and the vias are connected to each other.

8. The semiconductor package of claim 7, wherein the metal paste of the metal pastes extends to the active surface of the first semiconductor chip.

9. The semiconductor package of claim 1, further comprising a third semiconductor chip disposed on the first semiconductor chip in the through-hole and having a third active surface having third connection pads disposed thereon,
   wherein the third active surface of the third semiconductor chip is attached to the first inactive surface of the first semiconductor chip, and the third semiconductor chip is disposed on the first semiconductor chip, to be mismatched to the first semiconductor chip so that the third connection pads are exposed,
   the redistribution layer of the connection member is connected to the third connection pads through third conductors, and
   the second and third conductors have the same height.

10. The semiconductor package of claim 9, further comprising:
    a fourth semiconductor chip disposed on the second semiconductor chip in the through-hole and having a fourth active surface having fourth connection pads disposed thereon; and
    a fifth semiconductor chip disposed on the third semiconductor chip in the through-hole and having a fifth active surface having fifth connection pads disposed thereon,
    wherein the fourth active surface of the fourth semiconductor chip is attached to a second inactive surface of the second semiconductor chip, and the fourth semiconductor chip is disposed on the second semiconductor chip, to be mismatched to the second semiconductor chip so that the fourth connection pads are exposed,
    the fifth active surface of the fifth semiconductor chip is attached to a third inactive surface of the third semiconductor chip, and the fifth semiconductor chip is disposed on the third semiconductor chip, to be mismatched to the third semiconductor chip so that the fifth connection pads are exposed,
    the redistribution layer of the connection member is connected to the fourth and fifth connection pads through fourth and fifth conductors, respectively, and
    the fourth and fifth conductors have heights greater than those of the second and third conductors.

11. The semiconductor package of claim 1, further comprising a third semiconductor chip disposed side by side with the first semiconductor chip in the through-hole and having a third active surface having third connection pads disposed thereon,
    wherein the second active surface of the second semiconductor chip is attached to the first inactive surfaces of the first semiconductor chip and a third inactive surface of the third semiconductor chip, and the second semiconductor chip is disposed on the first and the third semiconductor chips, to be mismatched to the first and third semiconductor chips so that the second connection pads are exposed,
    the redistribution layer of the connection member is connected to the third connection pads through third conductors, and
    the first and third conductors have the same height.

12. The semiconductor package of claim 1, further comprising a third semiconductor chip disposed on the second semiconductor chip in the through-hole and having a third active surface having third connection pads disposed thereon,
    wherein the third active surface of the third semiconductor chip is attached to a second inactive surface of the second semiconductor chip, and the third semiconductor chip is disposed on the second semiconductor chip, to be mismatched to the second semiconductor chip so that the third connection pads are exposed,
    the redistribution layer of the connection member is connected to the third connection pads through third conductors, and
    the third conductor has a height greater than those of the first and second conductors.

13. The semiconductor package of claim 1, further comprising a third semiconductor chip disposed side by side with the first semiconductor chip in the through-hole and having a third active surface having third connection pads disposed thereon,
    a fourth semiconductor chip disposed on the third semiconductor chip in the through-hole and having a fourth active surface having fourth connection pads disposed thereon,
    wherein the fourth active surface of the fourth semiconductor chip is attached to a third inactive surface of the third semiconductor chip, and the fourth semiconductor chip is disposed on the third semiconductor chip, to be mismatched to the third semiconductor chip so that the fourth connection pads are exposed,
    the redistribution layer of the connection member is connected to the third and fourth connection pads through third conductors and fourth conductors, respectively, and
    a fourth conductor of the fourth conductors has a height greater than that of a third conductor of the third conductors.

14. The semiconductor package of claim 1, wherein the first connection pads and the second connection pads oppose each other in a horizontal direction.

15. The semiconductor package of claim 1, wherein a horizontal cross-sectional area of the second semiconductor chip is greater than that of the first semiconductor chip.

16. The semiconductor package of claim 1, wherein the core member includes a first insulating layer, a first redistribution layer in contact with the connection member and embedded in a first surface of the first insulating layer, and a second redistribution layer disposed on a second surface of the first insulating layer opposing the first surface of the first insulating layer.

17. The semiconductor package of claim 16, wherein the core member further includes a second insulating layer disposed on the first insulating layer and covering the second redistribution layer and a third redistribution layer disposed on the second insulating layer.

18. The semiconductor package of claim 1, wherein the core member includes a first insulating layer, a first redistribution layer and a second redistribution layer disposed on opposite surfaces of the first insulating layer, respectively, a second insulating layer disposed on the first insulating layer and covering the first redistribution layer, and a third redistribution layer disposed on the second insulating layer.

19. The semiconductor package of claim 18, wherein the core member further includes a third insulating layer disposed on the first insulating layer and covering the second redistribution layer and a fourth redistribution layer disposed on the third insulating layer.

20. The semiconductor package of claim 1, wherein the second active surface of the second semiconductor chip is attached to the first inactive surface of the first semiconductor chip that is disposed opposite the first active surface of the first semiconductor chip.

21. The semiconductor package of claim 1, wherein the core member comprises a first insulating layer disposed on a surface of the connection member, and a second insulating layer disposed on the first insulating layer.

* * * * *